(12) United States Patent
Song et al.

(10) Patent No.: US 11,617,276 B2
(45) Date of Patent: *Mar. 28, 2023

(54) DISPLAY DEVICE FOR VEHICLE

(71) Applicant: LG ELECTRONICS INC., Seoul (KR)

(72) Inventors: Seunghwan Song, Seoul (KR); Sang-Hyeun Son, Incheon (KR); In Koo Shim, Gyeonggi-do (KR)

(73) Assignee: LG ELECTRONICS INC., Seoul (KR)

( * ) Notice: Subject to any disclaimer, the term of this patent is extended or adjusted under 35 U.S.C. 154(b) by 308 days.

This patent is subject to a terminal disclaimer.

(21) Appl. No.: 16/931,158

(22) Filed: Jul. 16, 2020

(65) Prior Publication Data
US 2021/0212225 A1 Jul. 8, 2021

(30) Foreign Application Priority Data
Jan. 8, 2020 (KR) .......................... 10-2020-0002809

(51) Int. Cl.
*B60K 35/00* (2006.01)
*G06F 1/16* (2006.01)
(Continued)

(52) U.S. Cl.
CPC ........... *H05K 5/0226* (2013.01); *B60K 35/00* (2013.01); *G06F 1/1601* (2013.01);
(Continued)

(58) Field of Classification Search
CPC .... H05K 5/0226; H05K 5/0017; B60K 35/00; B60K 37/02; B60K 2370/152;
(Continued)

(56) References Cited

U.S. PATENT DOCUMENTS

2018/0321892 A1* 11/2018 Kim ...................... G06F 1/1647
2018/0335800 A1 11/2018 Kim et al.
(Continued)

FOREIGN PATENT DOCUMENTS

DE 102018208250 9/2019
DE 102018215596 10/2019
(Continued)

OTHER PUBLICATIONS

KR Office Action in Korean Appln. No. 10-2020-0002809, dated Jun. 14, 2021, 17 pages (with English translation).
(Continued)

*Primary Examiner* — Douglas M Wilson
(74) *Attorney, Agent, or Firm* — Fish & Richardson P.C.

(57) ABSTRACT

A display device is configured to be mounted in an indoor space of a vehicle and to change a display area. The display device includes a first frame having a first end configured to be coupled to an interior member of the vehicle, a second frame having a first end coupled to a second end of the first frame, and a flexible display disposed at a first surface of the first frame and a first surface of the second frame. The second frame is configured to rotate about the second end of the first frame, and the flexible display is configured to fold to allow the first surface of the first frame to face the first surface of the second frame.

18 Claims, 14 Drawing Sheets

(51) Int. Cl.
  *H05K 5/00* (2006.01)
  *B60K 37/02* (2006.01)
  *B60R 11/00* (2006.01)
  *F16H 1/20* (2006.01)
  *B60R 11/02* (2006.01)
  *H05K 5/02* (2006.01)

(52) U.S. Cl.
  CPC ............ *H05K 5/0017* (2013.01); *B60K 37/02* (2013.01); *B60K 2370/152* (2019.05); *B60K 2370/1533* (2019.05); *B60K 2370/332* (2019.05); *B60K 2370/67* (2019.05); *B60K 2370/80* (2019.05); *B60K 2370/91* (2019.05); *B60R 11/0235* (2013.01); *B60R 2011/0003* (2013.01); *B60R 2011/0057* (2013.01); *B60R 2011/0082* (2013.01); *B60R 2011/0085* (2013.01); *B60R 2011/0092* (2013.01); *F16H 1/20* (2013.01); *G09G 2380/10* (2013.01)

(58) Field of Classification Search
  CPC ...... B60K 2370/1533; B60K 2370/332; B60K 2370/67; B60K 2370/80; B60K 2370/91; G06F 1/1601; B60R 11/0235; B60R 2011/0003; B60R 2011/0057; B60R 2011/0082; B60R 2011/0085; B60R 2011/0092; F16H 1/20
  See application file for complete search history.

(56) References Cited

U.S. PATENT DOCUMENTS

| 2019/0166703 | A1* | 5/2019 | Kim | G06F 1/1652 |
| 2020/0137905 | A1* | 4/2020 | Redeker | B60K 35/00 |
| 2020/0196460 | A1* | 6/2020 | Myers | H05K 5/0217 |
| 2020/0383219 | A1* | 12/2020 | Hale | G06F 1/1641 |
| 2021/0076517 | A1* | 3/2021 | Wang | H04M 1/0268 |
| 2021/0129635 | A1* | 5/2021 | Park | G09F 21/04 |

FOREIGN PATENT DOCUMENTS

| EP | 2993551 | 3/2016 |
| KR | 1020170027163 | 3/2017 |
| KR | 1020170052086 | 5/2017 |
| KR | 1020170064623 | 6/2017 |
| KR | 1020180029590 | 3/2018 |
| KR | 1020190001864 | 1/2019 |
| KR | 10-2041965 | 11/2019 |
| KR | 10-2019-0139645 | 12/2019 |
| WO | WO2019200885 | 10/2019 |

OTHER PUBLICATIONS

Notice of Allowance in European Appln. No. 20178755.3, dated Dec. 9, 2021, 7 pages.
Extended European Search Report in European Application No. 20178755.3, dated Nov. 27, 2020, 7 pages.

* cited by examiner

DISPLAY DEVICE FOR VEHICLE

CROSS-REFERENCE TO RELATED APPLICATION

This present application claims the benefit of priority to Korean Patent Application No. 10-2020-0002809, entitled "DISPLAY DEVICE FOR VEHICLE," filed on Jan. 8, 2020, the entire disclosure of which is incorporated herein by reference.

TECHNICAL FIELD

The present disclosure relates to a vehicle display device, and more particularly to a vehicle display device that is mounted in an indoor space of a vehicle and is capable of changing a display area.

BACKGROUND

A vehicle may transport a user in a direction desired by the user. A car may be an example of the vehicle. In some cases, a vehicle may include various types of sensors and electronic devices for convenience of the user using the vehicle.

For instance, a vehicle may include an Advanced Driver Assistance System (ADAS) for driving convenience of a user. In some cases, a vehicle may perform autonomous driving.

In some cases, a vehicle may include displays disposed at various positions in a vehicle to display a variety of information such as vehicle-to-everything (V2X) information and vehicle information. As the number of functions that an occupant can perform through a display increases for autonomous driving, various methods may control a display mounted in the vehicle.

In some cases, a display device mounted in the indoor space of a vehicle may be used to indicate information about the vehicle to persons located outside the vehicle or to other vehicles.

In some cases, the vehicle display device may include a head-up display device.

For example, the head-up display device may include a sensor for sensing collision of a vehicle, a controller for operating an actuator in response to a sensing signal from the sensor, and a collision preventer supported by the actuator and configured to, forcibly rotate a holder to guide insertion of a combiner into a case in response to a hinge being disengaged from the actuator under the control of the controller, thereby rapidly returning the combiner in the event of a collision of the vehicle to avoid a collision between the combiner and a driver.

In some cases, a display device may be configured to be rotatable at the installation position thereof to be changed to a closed state as needed, but may not change the shape of the vehicle display device according to various use environments. For example, the display device may not change the display area according to the needs of a user.

In some cases, a display device provided in a vehicle may change a mode of display according to the current state of an occupant. For example, the display may be automatically divided or merged depending on whether an occupant is in a vehicle.

In some cases, a plurality of displays may be mounted in a vehicle in a substantially fixed manner and configured such that only the area of a screen on which an image is displayed is controlled differently depending on the current state of an occupant.

SUMMARY

The present disclosure describes a vehicle display device capable of changing the area of a display according to the needs of a user, thereby optimizing the display function for user convenience as well as supporting the inherent functions of a vehicle.

The present disclosure also describes a vehicle display device for preventing or reducing deterioration of display function during the change in the area of a display according to the needs of the user, thereby ensuring improved user convenience.

The present disclosure further describes a vehicle display device capable of adjusting an angle at which a display protrudes upwards with respect to an interior member of a vehicle during the change in the area of the display according to the needs of the user, thereby improving user convenience by avoiding interference between components.

Aspects of the present disclosure are not limited to the above-mentioned aspects, and other technical aspects not mentioned above will be clearly understood by those skilled in the art from the following description.

According to one aspect of the subject matter described in this application, a display device is configured to be mounted in an indoor space of a vehicle and to change a display area. The display device includes a first frame having a first end configured to be coupled to an interior member of the vehicle, a second frame having a first end coupled to a second end of the first frame, and a flexible display disposed at a first surface of the first frame and a first surface of the second frame. The second frame is configured to rotate about the second end of the first frame, and the flexible display is configured to fold to allow the first surface of the first frame to face the first surface of the second frame.

Implementations according to this aspect may include one or more of the following features. For example, the display device may include an auxiliary display disposed on a second surface of the second frame opposite to the first surface of the second frame. In some examples, the display device may include an elastic part configured to apply tension to the flexible display in a direction toward an inside of the interior member based on the flexible display being unfolded. For example, the elastic part may include a shaft that protrudes from the first end of the first frame into the interior member, a moving body coupled to the shaft and configured to move in a longitudinal direction of the shaft, a connector that connects the flexible display and the moving body to each other, and an elastic body disposed between the first end of the first frame and the moving body and configured to apply elastic force to the moving body.

In some implementations, the display device may include a support bar that is disposed at an end portion of the flexible display and extends in a width direction of the flexible display, and the connector may include an end coupled to the support bar and another end coupled to the moving body.

In some implementations, the first frame may protrude upward relative to a surface of the interior member of the vehicle, and the second frame may be configured to be inclined with respect to the first frame. In some examples, the display device may include a first hinge that is disposed between the first frame and the second frame and connects the second frame to the first frame, where the first hinge is configured to adjust a coupling angle between the second frame and the first frame.

In some examples, the first hinge may include a first gear disposed at the second end of the first frame, where the first frame is configured to restrict rotation of the first gear, a second gear disposed at the first end of the second frame, where the second frame is configured to restrict rotation of the second gear, a third gear engaged with the first gear and configured to rotate with respect to the first gear, and a fourth gear engaged with the second gear and the third gear and configured to transmit rotational force between the second gear and the third gear. In some implementations, the first hinge may further include a first motor coupled to the fourth gear and configured to provide driving force to the fourth gear.

In some implementations, the display device may include a metallic backplate that is attached to a rear surface of the flexible display and faces the first surface of the first frame and the first surface of the second frame, and a magnet disposed at the first hinge and configured to provide magnetic force to attach between the metallic backplate to the first hinge.

In some implementations, at least a portion of the first frame may be configured to protrude from a surface of the interior member of the vehicle, and the first frame may be configured to vary a protruding angle of the first frame with respect to the surface of the interior member. The flexible display may be configured to be unfolded based on the protruding angle of the first frame being greater than or equal to a preset value.

In some implementations, the display device may include a hinge that is disposed between the first frame and the interior member and connects the first frame to the interior member, the hinge being configured to adjust a coupling angle between the first frame and the interior member. For example, the hinge may include a first gear disposed at the interior member, a second gear disposed at the first end of the first frame and engaged with the first gear, where the first frame is configured to restrict rotation angle of the second gear, and a motor coupled to the first gear and configured to provide driving force to rotate the first gear. In some examples, the hinge may further include a limiting protrusion configured to limit rotation of the first frame relative to the interior member.

In some implementations, the flexible display may have at least a portion configured to wind around the first frame. For instance, the first frame may include a roller disposed at the first end of the first frame, and at least the portion of the flexible display is configured to wind around the roller. In some examples, the first frame may include an insertion portion that is configured to insert into the interior member based on the flexible display being folded, and to move to an outside of the interior member based on the flexible display being unfolded. In some examples, at least the portion of the flexible display may be configured to unwind from the roller based on movement of the first frame.

In some implementations, the first frame may include an inner body that is coupled to the first end of the first frame, that is disposed inside the interior member, and that is configured to move upward and downward relative to the interior member, and a linear actuator that extends along a movement direction of the first frame relative to the interior member and defines a movement path of the inner body. The linear actuator may be configured to transmit driving force to move the inner body.

In some examples, the linear actuator may include a screw shaft that is disposed inside the interior member, that extends along the move direction of the first frame, and that has threads defined at an outer surface of the screw shaft, a motor disposed inside the interior member and configured to rotate the screw shaft, and a slider coupled to the inner body of the first frame and configured to move along the screw shaft based on rotation of the screw shaft.

In some implementations, the flexible display disposed on one surface of the first frame and one surface of the second frame may be foldable in the direction in which the one surface of the first frame and the one surface of the second frame overlap each other, it may be possible to optimally change the screen area of the flexible display according to the needs of the user.

In some implementations, an auxiliary display may be disposed on the opposite surface of the second frame, which may enable a display function using the auxiliary display when the flexible display is in the folded state.

In some implementations, when the flexible display is unfolded, the elastic part may apply tension to the flexible display to maintain the flatness of the surface of the flexible display. Accordingly, when the screen area of the flexible display is changed, the display function of the flexible display may be maintained.

In some implementations, since the elastic part applies tension to the flexible display using the elastic force generated by an elastic shaft, a moving body, a connector, and an elastic body, it may be possible to more stably apply tension to the flexible display.

In some implementations, since the elastic part applies tension to the flexible display by pulling a support bar disposed at an end portion of the flexible display in the width direction of the flexible display, the tension applied to the end portion of the flexible display may be evenly distributed in the width direction of the flexible display.

In some implementations, the first frame may protrude upwards above the surface of an interior member, and the second frame may be disposed so as not to be parallel to the first frame, which may help to prevent the flexible display from being excessively folded, thus minimizing damage thereto or deterioration in the function thereof.

In some implementations, since the angle between the first frame and the second frame is adjusted using a first hinge, it may be possible for the user to appropriately adjust the angle between the first frame and the second frame according to user needs.

In some implementations, since the angle between the first frame and the second frame is adjusted by the rotational force transmitted through a first gear, a second gear, a third gear, and a fourth gear, which constitute the first hinge, it may be possible to more smoothly and easily adjust the angle between the first frame and the second frame.

In some implementations, since the angle between the first frame and the second frame is automatically adjusted by the driving force supplied from a first motor of the first hinge, it may be possible to more easily adjust the angle between the first frame and the second frame without the necessity of manual operation by the user.

In some implementations, since a metallic backplate attached to the rear surface of the flexible display is attracted to the first hinge by the magnetic force of a magnet mounted in the first hinge, it may be possible to minimize or prevent a gap formation between the flexible display and the first hinge during a change in the screen area of the flexible display.

In some implementations, since the flexible display is unfolded in response to the protruding angle of the first frame with respect to the surface of the interior member being adjusted to be equal to or greater than a preset value, it may be possible to avoid interference between components during the change in the screen area of the flexible display.

In some implementations, since the angle between the interior member and the first frame is adjusted using a second hinge, it may be possible for the user to appropriately adjust the angle between the interior member and the first frame according to the needs of the user.

In some implementations, since the angle between the interior member and the first frame is adjusted by a fifth gear, a sixth gear, and a second motor, which constitute the second hinge, it may be possible to more smoothly and easily adjust the angle between the interior member and the first frame.

In some implementations, since the rotation angle of the first frame is limited by a limiter of the second hinge, it may be possible to restrict the first frame from being rotated in an unnecessary direction, thus preventing or reducing deterioration in the usability of the vehicle display device.

In some implementations, since at least a portion of the flexible display is wound on the first frame, it may be possible to secure an extra portion of the flexible display, thereby further increasing the screen area of the flexible display.

In some implementations, since at least a portion of the flexible display is wound on a roller disposed at one end of the first frame, it may be possible to easily store the extra portion of the flexible display.

In some implementations, since the portion of the first frame that is inserted into the interior member is exposed to the outside of the interior member when the flexible display is unfolded, it may be possible to further increase the height that the flexible display protrudes upwards above the surface of the interior member when unfolded.

In some implementations, since the extra portion of the flexible display that is wound on the roller is spread correspondingly to the exposure of the first frame to the outside of the interior member, it may be possible to additionally increase the screen area of the flexible display when the flexible display is unfolded.

In some implementations, since the first frame is moved into and out of the interior member by an ascending/descending body and a linear actuator, it may be possible to more smoothly and easily move the first frame.

Further scope of applicability of the present disclosure will be apparent from the above detailed description. It should be understood, however, that specific examples, such as the detailed description and the example implementations of the present disclosure, are given by way of illustration only, since various changes and modifications within the spirit and scope of the present disclosure will become apparent to those skilled in the art.

BRIEF DESCRIPTION OF THE DRAWINGS

The above and other aspects, features, and advantages of the present disclosure will become apparent from the detailed description of the following aspects in conjunction with the accompanying drawings.

DETAILED DESCRIPTION

Figure 1:
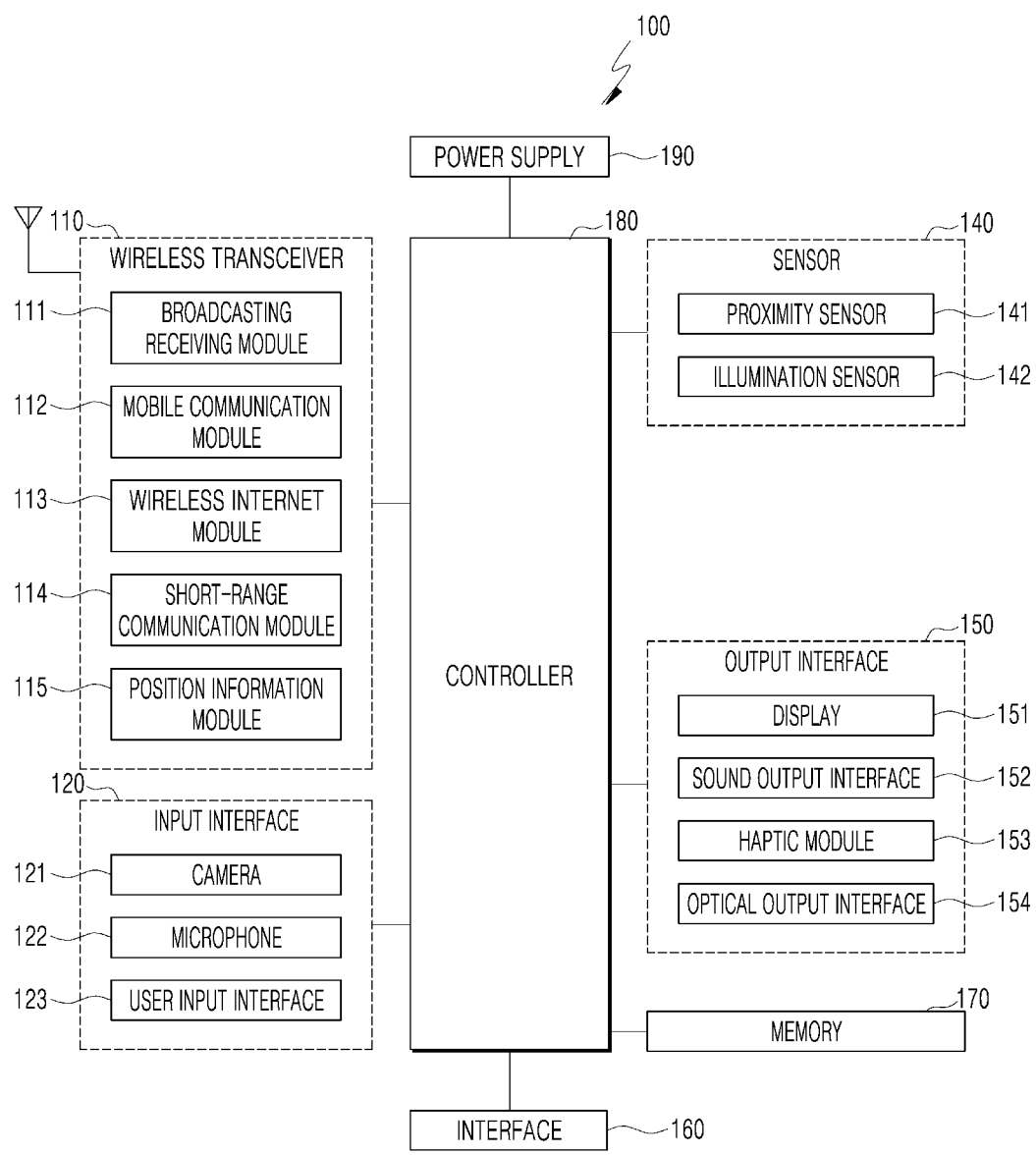
FIG. 1 is a block diagram showing example components of a vehicle display device.

Hereinafter, one or more implementations of the present disclosure will be described in detail with reference to accompanying drawings, and the same or similar elements are designated with the same numeral references regardless of numerals in the drawings and their redundant description will be omitted. The accompanying drawings are merely used to help easily understand implementations of the present disclosure, and it should be understood that the technical idea of the present disclosure is not limited by the accompanying drawings, and these implementations include all changes, equivalents or alternatives within the idea and the technical scope of the present disclosure.

FIG. 1 is a block diagram for explaining a vehicle display device 100.

The vehicle display device 100 includes a wireless transceiver 110, an input interface 120, a sensor 140, an output interface 150, an interface 160, a memory 170, a controller 180, and a power supply 190. In some examples, the vehicle display device may include more or fewer components than the components illustrated in FIG. 1.

More specifically, the wireless transceiver 110 may include one or more modules which enable wireless communication between the vehicle display device 100 and a wireless communication system, between the vehicle display device 100 and another vehicle display device 100, or between the vehicle display device 100 and an external server. Further, the wireless transceiver 110 may include one or more modules which connect the vehicle display device 100 to one or more networks.

The wireless transceiver 110 may include at least one of a broadcasting receiving module 111, a mobile communication module 112, a wireless Internet module 113, a short-range communication module 114, or a position information module 115.

The input interface 120 may include a camera 121 or an image input interface which receives input of an image signal, a microphone 122 or an audio input interface which receives input of an audio signal, and a user input interface 123 (for example, a touch key or a mechanical key) which receives information from a user. Voice data or image data collected by the input interface 120 is analyzed and processed as a control command of the user.

The sensor 140 may include one or more sensors which sense at least one of information in the vehicle display device, surrounding environment information around the vehicle display device, or user information. For example, the sensor 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, a camera 121 or a microphone 122), a battery gauge, an environment sensor (for example, a barometer, a hygrometer, a thermometer, a radiation sensor, a thermal sensor, and a gas sensor), or a chemical sensor (for example, an electronic nose, a healthcare sensor, and a biometric sensor). Further, the vehicle display device disclosed in the present specification may combine and utilize information sensed by at least two sensors from the above-mentioned sensors.

The output interface 150 generates outputs related to visual, auditory, or tactile senses, and may include at least one of a display 151, a sound output interface 152, a haptic module 153, or an optical output interface 154. The display 151 may be configured as a touch screen by forming a mutual layered structure with a touch sensor or being formed integrally therewith. The touch screen may simultaneously serve as a user input interface 123 for providing an input interface between the vehicle display device 100 and the user and an output interface between the vehicle display device 100 and the user.

The interface 160 serves as a passage between various types of external devices which are connected to the vehicle display device 100. The interface 160 may include at least one of a wired/wireless headset port, an external charger port, a wired/wireless data port, a memory card port, a port which connects a device equipped with an identification module, an audio input/output (I/O) port, a video input/output (I/O) port, or an earphone port. The vehicle display device 100 may perform appropriate control related to the connected external device in accordance with the connection of the external device to the I/O connector or interface 160.

Further, the memory 170 may store data which supports various functions of the vehicle display device 100. The memory 170 may store a plurality of application programs or applications that are driven by the vehicle display device 100, data for operating the vehicle display device 100, and instructions. At least some of the application programs may be downloaded via an external server through wireless communication. Further, at least some of the application programs, related to basic functions of the vehicle display device 100 (for example, incoming and outgoing call functions, and message receiving and sending functions), may be installed in the vehicle display device 100 from the time of release. The application programs are stored in the memory 170, and are installed in the vehicle display device 100 and driven by the controller 180 to perform operations (or functions) of the vehicle display device.

In addition to the operations related to the application programs, the controller 180 may control the overall operation of the vehicle display device 100. The controller 180 may process signals, data, or information which is inputted or outputted through the above-described components, or drive the application programs stored in the memory 170 to provide or process appropriate information or functions to the user.

Further, in order to drive the application program stored in the memory 170, the controller 180 may control at least some of the components described with reference to FIG. 1.

Moreover, the controller 180 may combine and operate at least two of the components included in the vehicle display device 100 to drive the application program. For example, the controller 180 may include one or more processors, a computer, an electric circuit, a microprocessor, or the like.

The power supply 190 receives application of external power, and supplies the power to the respective components included in the vehicle display device 100 under the control of the controller 180. At least some of the above-described components may operate in cooperation with each other to implement the operation, the control, or the control method of the vehicle display device according to various implementations, which will be described below. Further, the operation, the control, or the control method of the vehicle display device may be implemented in the vehicle display device by driving at least one application program stored in the memory 170.

Hereinafter, prior to describing various examples implemented by the vehicle display device 100 described above, the above-mentioned components will be described in more detail with reference to FIG. 1.

First, the wireless transceiver 110 will be described. The broadcasting receiving module 111 of the wireless transceiver 110 receives a broadcasting signal and/or broadcasting-related information from an external broadcasting management server through a broadcasting channel. The broadcasting channel may include a satellite channel and a ground wave channel. Two or more broadcasting receiving modules for simultaneous broadcasting reception or broadcasting channel switching for at least two broadcasting channels may be provided in the vehicle display device 100.

The broadcasting management server may refer to a server which generates and transmits a broadcasting signal and/or broadcasting-related information, or a server which is supplied with a previously generated broadcasting signal and/or broadcasting-related information and transmits the broadcasting signal and/or the broadcasting-related information to the vehicle display device. The broadcasting signal includes not only a TV broadcasting signal, a radio broadcasting signal, and a data broadcasting signal, but also a broadcasting signal obtained by combining a TV broadcasting signal or a radio broadcasting signal with a data broadcasting signal.

The broadcasting signal may be encoded according to at least one technical standard for transmitting and receiving a digital broadcasting signal (or broadcasting schemes, for example, ISO, IEC, DVB, or ATSC), and the broadcasting receiving module 111 may receive the digital broadcasting signal using an appropriate method for the technical specification determined by the technical standard.

The broadcasting-related information may refer to information related to a broadcasting channel, a broadcasting program, or a broadcasting service provider. The broadcasting-related information may also be provided through the mobile communication network. In some cases, the broadcasting-related information may be received by the mobile communication module 112.

The broadcasting-related information may exist in various types such as an electronic program guide of digital multimedia broadcasting (DMB) or an electronic service guide of a digital video broadcast-handheld (DVB-H). The broadcasting signal and/or the broadcasting-related information received by the broadcasting receiving module 111 may be stored in the memory 170.

The mobile communication module 112 may include a modem that may transmit/receive a wireless signal to/from at least one among a base station, an external terminal, or a server on a mobile communication network established according to the technical standards or communication methods for mobile communication (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)).

The wireless signal may include a voice call signal, a video call signal, or various types of data in accordance with transmission or reception of a text/multimedia message.

The wireless Internet module 113 refers to a module for wireless Internet access and may be built in or external to the vehicle display device 100. The wireless Internet module 113 may be configured to transmit/receive a wireless signal in a communication network according to wireless Internet technologies.

Wireless Internet technologies may include wireless LAN (WLAN), wireless fidelity (Wi-Fi), Wi-Fi direct, Digital Living Network Alliance (DLNA), wireless broadband (WiBro), Worldwide Interoperability for Microwave Access (WiMAX), High Speed Downlink Packet Access (HSDPA), High Speed Uplink Packet Access (HSUPA), Long Term Evolution (LTE), and Long Term Evolution-Advanced (LTE-A). The wireless Internet module 113 may transmit or receive data in accordance with at least one of the wireless Internet technologies or other types of Internet technologies.

From the viewpoint that the wireless Internet connection by WiBro, HSDPA, HSUPA, GSM, CDMA, WCDMA, LTE, LTE-A, etc. is performed through a mobile communication network, the wireless Internet module 113 which performs the wireless Internet connection through the mobile communication network may be understood as a type of the mobile communication module 112.

The short-range communication module 114 may support short-range communication using at least one of Bluetooth™, radio frequency identification (RFID), infrared data association (IrDA), ultra wideband (UWB), ZigBee, Short-range Communication (NFC), wireless fidelity (Wi-Fi), Wi-Fi Direct, or Wireless Universal Serial Bus (Wireless USB). The short-range communication module 114 may support wireless communication between the vehicle display device 100 and the wireless communication system, between the vehicle display device 100 and another vehicle display device 100, or between the vehicle display device 100 and a network in which the other vehicle display device 100 (or external server) is located, through a short-range wireless communication network. The short-range wireless communication network may be a short-range wireless personal communication network.

The position information module 115 may include a Global Navigation Satellite System (GNSS) sensor that is configured to obtain the location (or the current location) of a vehicle display device, and its representative examples include a global positioning system (GPS) module or a Wi-Fi module. For example, when a GPS module is utilized, the vehicle display device may obtain the position of the vehicle display device using a signal transmitted from a GPS satellite. As another example, when a Wi-Fi module is utilized, the vehicle display device may obtain the position of the vehicle display device based on information of a wireless access point (AP) which transmits and receives wireless signals with the Wi-Fi module. In some cases, the position information module 115 may perform a function of another module of the wireless transceiver 110 to alternatively or additionally obtain data on the position of the vehicle display device. As a module used to obtain a position (or a current position) of the vehicle display device, the position information module 115 is not limited to a module which directly calculates or obtains the position of the vehicle display device.

Next, the input interface 120 is provided to input video information (or signals), audio information (or signals), data, or information inputted from the user. In order to receive input of video information, the vehicle display device 100 may include one or more cameras 121. The camera 121 processes an image frame such as a still image or a moving image obtained by an image sensor in a video call mode or a photographing mode. The processed image frames may be displayed on the display 151 or stored in the memory 170. Further, the plurality of cameras 121 equipped in the vehicle display device 100 may be disposed to form a matrix structure, and a plurality of pieces of image information having various angles or focal points may be inputted to the vehicle display device 100 through the cameras 121 that form the matrix structure. Further, the cameras 121 may be disposed to have a stereo structure to obtain a left image and a right image to implement a stereoscopic image.

The microphone 122 processes an external sound signal as electronic voice data. The processed voice data may be utilized in various forms in accordance with a function being performed by the vehicle display device 100 (or an application program which is being executed). In some examples, the microphone 122 may implement various noise removal algorithms to remove noise generated during the process of receiving the external sound signal.

The user input interface 123 receives information from the user, and when the information is inputted through the user input interface 123, the controller 180 may control the operation of the vehicle display device 100 to correspond to the inputted information. In some implementations, the user input interface 123 may include a mechanical input interface (or a mechanical key, for example, a button located on a front, rear, or side surface of the vehicle display device 100, a dome switch, a jog wheel, a jog switch, or the like) and a touch type input interface. In some implementations, the touch type input interface may include a graphical key, a virtual key, a soft key, or a visual key displayed on the touch screen via a software process, or may include a touch key disposed on a portion other than the touch screen. The virtual key or the visual key may be displayed on the touch screen in various shapes, and for example, may be formed by graphics, text, icons, video, or a combination thereof.

The sensor 140 senses at least one of information in the vehicle display device, surrounding environment information around the vehicle display device, or user information, and generates a sensing signal corresponding to the information. The controller 180 may control the driving or the operation of the vehicle display device 100 or perform data processing, functions, or operations related to the application programs installed in the vehicle display device 100, based on the sensing signal. Representative sensors among the various sensors which may be included in the sensor 140 will be described in more detail below.

First, the proximity sensor 141 is a sensor which senses the presence of an object approaching a predetermined sensing surface or nearby objects, using an electromagnetic field force or infrared ray without any mechanical contact. The proximity sensor 141 may be disposed in an internal area of the vehicle display device, which is enclosed by the above-described touch screen, or in the vicinity of the touch screen.

Examples of the proximity sensor 141 may include a transmission type photoelectric sensor, a direct reflection type photoelectric sensor, a mirror reflection type photoelectric sensor, a high frequency oscillation type proximity sensor, a capacitive proximity sensor, a magnetic proximity sensor, and an infrared proximity sensor. When the touch screen is a capacitive type, the proximity sensor 141 may be configured to detect the proximity of the object with a change in the electric field in accordance with the proximity of the object having conductivity. In this case, the touch screen (or the touch sensor) itself may be classified as a proximity sensor.

For convenience of description, when an object approaches the touch screen without contacting the touch screen, and it is recognized that the object is located above the touch screen, it is referred to as a "proximity touch." When the object actually touches the touch screen, it is referred to as a "contact touch". A position at which the object proximately touches the touch screen refers to a position at which the object vertically corresponds to the touch screen when the object proximately touches the touch screen. The proximity sensor 141 may sense a proximate touch and a proximate touch pattern (for example, a proximate touch distance, a proximate touch direction, a proximate touch speed, a proximate touch time, a proximate touch position, a proximate touch movement state, etc.). As described above, the controller 180 may process data (or information) corresponding to the proximate touch operation and the proximate touch pattern sensed by the proximity sensor 141, and may further output visual information corresponding to the processed data on the touch screen. Furthermore, the controller 180 may control the vehicle display device 100 to process different operations or data (or information) depending on whether the touch on the same point on the touch screen is a proximity touch or a contact touch.

The touch sensor senses a touch (or a touch input) applied to the touch screen (or the display 151) using at least one of various touch types such as a resistive film type, a capacitive type, an infrared type, an ultrasonic type, and a magnetic field type.

For example, the touch sensor may be configured to convert a change of a pressure which is applied to a specific portion of the touch screen, or a capacitance which is generated in a specific portion, into an electrical input signal. The touch sensor may be configured to detect a position and an area where a touch subject which applies a touch onto the touch screen is touched on the touch sensor, and a capacitance at the time of the touch. Here, the touch subject is an object which applies a touch to the touch sensor, and may include, for example, a finger, a touch pen, a stylus pen, and a pointer.

As described above, when there is a touch input to the touch sensor, corresponding signals are transmitted to a touch controller. The touch controller processes the signal(s) and then transmits corresponding data to the controller 180. By doing this, the controller 180 may confirm which area of the display 151 is touched. Here, the touch controller may be a separate component from the controller 180, or may be the controller 180 itself.

The controller 180 may perform different control or the same control depending on a type of a touch subject which touches the touch screen (or a touch key equipped other than the touch screen). Whether to perform the different control or the same control depending on the type of touch subject may be determined in accordance with an operating state of the vehicle display device 100 or an application program which is being executed.

The touch sensor and proximity sensor described above may, independently or in combination, sense various types of touches on the touch screen, such as a short (or tap) touch, a long touch, a multi touch, a drag touch, a flick touch, a pinch-in touch, a pinch-out touch, a swipe touch, or a hovering touch.

The ultrasonic sensor may recognize position information of a sensing object using an ultrasonic wave. The controller 180 may calculate a position of a wave generating source by information sensed by the optical sensor and the plurality of ultrasonic sensors. A position of the wave generating source may be calculated using the property that light is much faster than an ultrasonic wave, that is, the time in which light reaches the optical sensor is much faster than the time in which the ultrasonic wave reaches the ultrasonic sensor. More specifically, the position of the wave generating source may be calculated using a time difference of the time of arrival of the ultrasonic wave with respect to light which serves as a reference signal.

As seen from the configuration of the input interface 120, the camera 121 includes at least one of a camera sensor (for example, a CCD or a CMOS), a photo sensor (or an image sensor), or a laser sensor.

The camera 121 and the laser sensor may be combined to sense a touch of a sensing object for a three-dimensional stereoscopic image. The photo sensor, which is laminated on a display element, is configured to scan a motion of a sensing object proximate to the touch screen. More specifically, the photo sensor is formed by mounting photo diodes and transistors (TR) in rows/columns to scan contents which are disposed on the photo sensor using an electrical signal that changes in accordance with an amount of light applied to the photo diode. That is, the photo sensor calculates coordinates of a sensing object in accordance with a changed amount of light, and position information of the sensing object may be obtained through the coordinates.

The display 151 displays (outputs) information processed in the vehicle display device 100. For example, the display 151 may display execution screen information of an application program driven in the vehicle display device 100 and user interface (UI) and graphic user interface (GUI) information in accordance with the execution screen information.

Further, the display 151 may be configured as a stereoscopic display which displays a stereoscopic image.

A three-dimensional display type such as a stereoscopic type (a glass type), an autostereoscopic type (a glass-free type), a projection type (a holographic type) may be applied to the stereoscopic display.

The sound output interface 152 may include a speaker that is configured to output audio data received from the wireless transceiver 110 or stored in the memory 170 in a call signal reception mode, a phone-call mode, a recording mode, a speech recognition mode, or a broadcasting reception mode. The sound output interface 152 may also output a sound signal related to a function (for example, a call signal reception sound or a message reception sound) performed in the vehicle display device 100. Such a sound output interface 152 may include, for example, a receiver, a speaker, and a buzzer.

The haptic module 153 may generate various tactile effects that can be felt by the user. A representative example of the tactile effect generated by the haptic module 153 may be vibration. For example, the haptic module 153 may include an actuator configured to generate vibration. An intensity and a pattern of the vibration generated in the haptic module 153 may be controlled by the selection of the user or a setting of the controller 180. For example, the haptic module 153 may compose different vibrations to output the composed vibrations, or sequentially output the different vibrations.

In addition to vibration, the haptic module 153 generates various tactile effects such as effects by a pin arrangement which vertically moves to a contact skin surface, an injection force or a suction force of air through an injection port or a suction port, grazing on a skin surface, electrode contact, or stimulation of an electrostatic force or effects of reproducing a cold or hot sensation using a heat absorbing or heat emitting element.

The haptic module 153 may not only transmit a tactile effect by means of direct contact, but may also be implemented to allow the user to feel a tactile effect by muscular sensation of a finger or an arm. Two or more haptic modules 153 may be provided in accordance with a configuration aspect of the vehicle display device 100.

The optical output interface 154 outputs a signal for notifying occurrence of an event using light of a light source of the vehicle display device 100. Examples of events generated in the vehicle display device 100 may be message reception, call signal reception, missed call, alarm, schedule notification, email reception, and information reception through an application.

The signal outputted from the optical output interface 154 is implemented as the vehicle display device emits single color or a plurality of color light to a front surface or a rear surface. When the vehicle display device senses the event confirmation of the user, the signal output may be completed.

The interface 160 serves as a passage with all external devices which are connected to the vehicle display device 100. The interface 160 receives data from the external device or is supplied with the power source to transmit the power source to each component in the vehicle display device 100, or transmits data in the vehicle display device 100 to the external device. For example, the interface 160 may include a wired/wireless headset port, an external charger port, a wired/wireless data port, a memory card port, a port which connects a device equipped with an identification module, an audio input/output (I/O) port, a video input/output (I/O) port, an earphone port, etc.

In some implementations, the identification module may include an electric circuit or device, for example, a chip in which various information for authenticating a usage right of the vehicle display device 100 is stored and includes a user identification module (UIM), a subscriber identification module (SIM), and a universal subscriber identity module (USIM). A device with an identification module (hereinafter, "identification device") may be manufactured as a smart card. Therefore, the identification device may be connected to the terminal through the I/O connector or interface 160.

The memory 170 may store a program for an operation of the controller 180, or temporarily store input/output data (for example, a phone book, a message, a still image, a moving image, etc.). The memory 170 may store data on a vibration or a sound of various patterns output when the touch is inputted onto the touch screen.

The memory 170 may include at least one type of non-transitory storage medium of a flash memory type, a hard disk type, a solid state disk (SSD) type, a silicon disk drive (SDD) type, a multimedia card micro type, and card type memories (for example, SD or XD memory and the like), a random access memory (RAM), a static random access memory (SRAM), a read only memory (ROM), an electrically erasable programmable read only memory (EEPROM), a programmable read only memory (PROM), a magnetic memory, a magnetic disk, and an optical disk. The vehicle display device 100 may operate in association with a web storage which performs a storage function of the memory 170 on the Internet.

As described above, the controller 180 may control an operation related to the application program and an overall operation of the vehicle display device 100. For example, when the state of the vehicle display device satisfies a predetermined condition, the controller 180 may execute or release a locking state which restricts an input of a control command of a user for the applications.

Further, the controller 180 may perform control and processing related to voice call, data communication, and video call, or perform a pattern recognition process which recognizes a handwriting input or a picture drawing input performed on the touch screen as a text or an image, respectively. Moreover, the controller 180 may control any one or a combination of a plurality of components described above to implement various examples which will be described below on the vehicle display device 100.

The display 151 may display (output) information processed in the vehicle display device 100. For example, the display 151 may display execution screen information of an application program driven in the vehicle display device 100 and user interface (UI) and graphic user interface (GUI) information in accordance with the execution screen information.

The display 151 may include at least one of a liquid crystal display (LCD), a thin film transistor liquid crystal display (TFT LCD), an organic light emitting diode (OLED), a three-dimensional display (3D display), an electronic ink display (e-ink display), or other types of flexible displays.

Further, two or more displays 151 may be provided in accordance with an implementation type of the vehicle display device 100. In this case, a plurality of displays may be disposed to be spaced apart from each other or integrally disposed on one surface of the vehicle display device 100 or may be disposed on different surfaces.

The display 151 may include a touch sensor which senses a touch on the display 151 to receive the control command by the touch method. Therefore, when the touch is made on the display 151, the touch sensor senses the touch, and based on the touch the controller 180 generates a control command corresponding to the touch. Contents inputted by the touch method may be letters or numbers, instructions in various modes, menu items which may be designated, or the like.

The microphone 122 is configured to receive a voice of the user, or other sounds. The microphone 122 is equipped in a plurality of locations to receive stereo sounds.

The interface 160 serves as a passage through which the vehicle display device 100 is connected to the external device. For example, the interface 160 may be at least one of a connection terminal for connection with other devices (for example, an earphone or an external speaker), a port for short-range communication (for example, an infrared port (IrDA port), a Bluetooth port, a wireless LAN port, etc.), or a power supply terminal for supplying a power to the vehicle display device 100. The interface 160 may be implemented as a socket type which accommodates an external card such as a subscriber identification module (SIM), a user identity module (UIM), and a memory card for information storage.

At least one antenna for wireless communication may be provided in a terminal body. The antenna may be embedded in the terminal body or formed in a case. For example, the antenna which forms a part of the broadcasting receiving module 111 (see FIG. 1) may be configured to be drawn from the terminal body. Alternatively, the antenna may be formed as a film type to be attached onto an inner surface of a housing, or a case including a conductive material may serve as an antenna.

Figure 2:
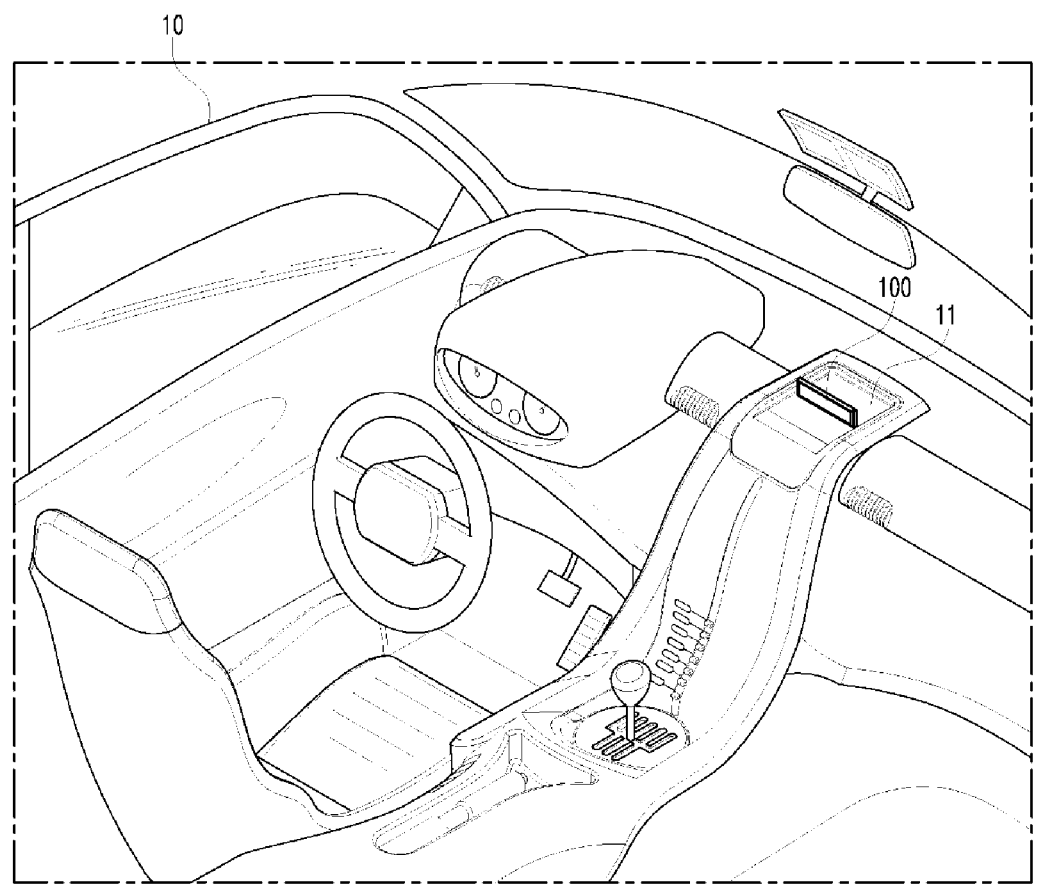
FIG. 2 is a view exemplarily showing an example state of a vehicle display device mounted in a vehicle.
Figure 3:
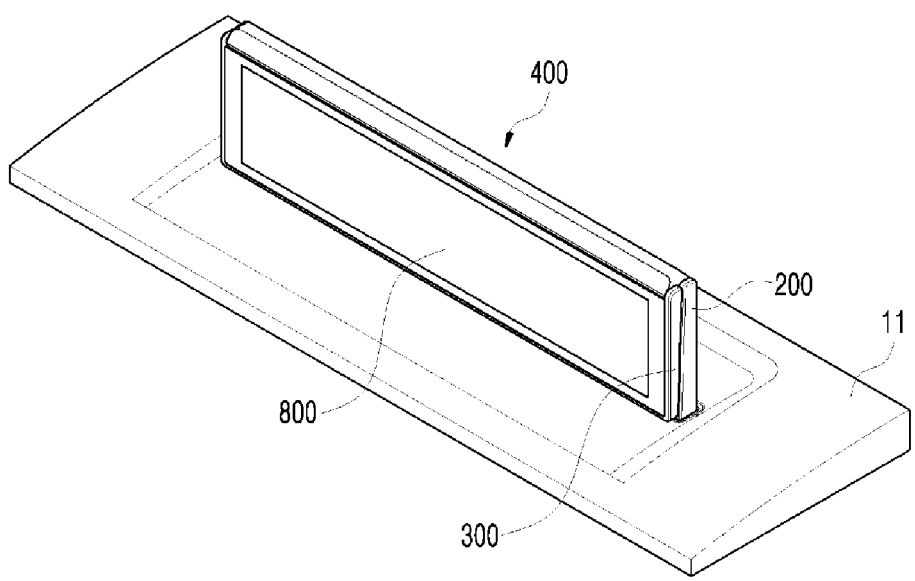
FIG. 3 is a view showing an example state of a vehicle display device that is folded.
Figure 4:
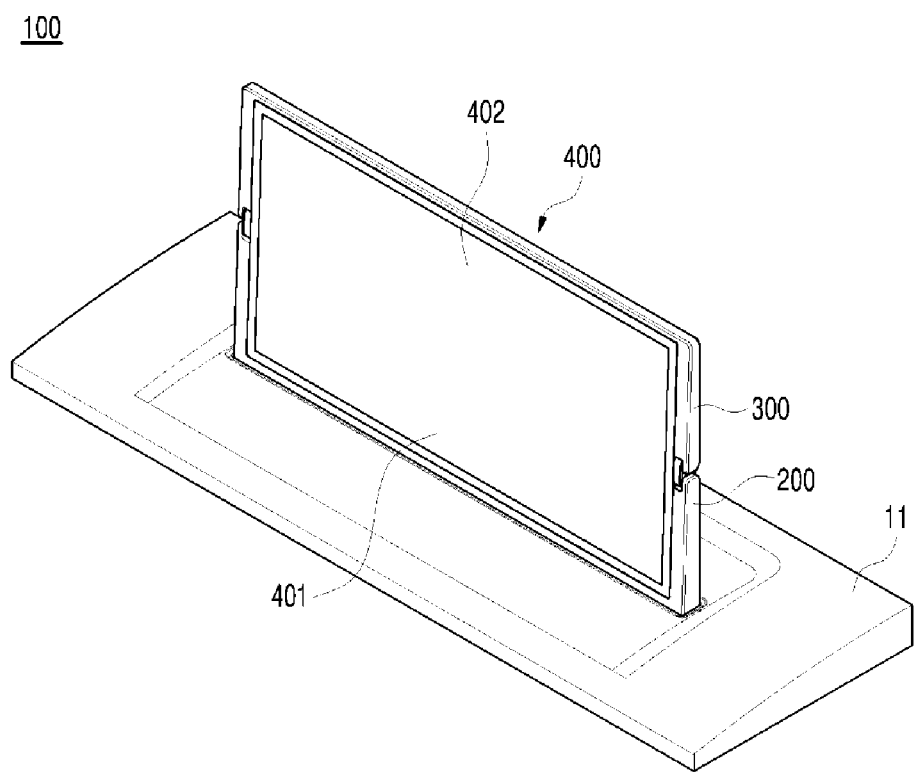
FIG. 4 is a view showing an example state of a vehicle display device that is unfolded.

FIG. 2 is a view exemplarily showing the state in which a vehicle display device is mounted in a vehicle. FIG. 3 is a view showing the state in which a vehicle display device is folded. FIG. 4 is a view showing the state in which a vehicle display device is unfolded.

As shown in FIGS. 2 to 4, the vehicle display device 100 is mounted in the indoor space of a vehicle 10, and is configured such that the area of a display changes. In this regard, the vehicle display device 100 includes a first frame 200, a second frame 300, and a flexible display 400.

The first frame 200 is coupled at one end thereof to an interior member 11 of the vehicle 10, and supports a portion (a first area 401) of the flexible display 400. The second frame 300 is coupled at one end thereof to the opposite end of the first frame 200 to be rotatable about the one end thereof with respect to the first frame 200, and supports the remaining portion (a second area 402) of the flexible display 400.

Accordingly, the first frame 200 and the second frame 300 rotate relative to each other at a preset angle in the state of being connected to each other. Through this rotation operation, the flexible display 400 may be folded or unfolded.

The flexible display 400 is disposed on one surface of the first frame 200 and one surface of the second frame 300, and is configured to be foldable in the direction in which the one surface of the first frame 200 and the one surface of the second frame 300 overlap each other.

That is, as shown in FIG. 4, the flexible display 400 is disposed on the one surface of the first frame 200 and the one surface of the second frame 300 in the unfolded state. In this case, since the screen area of the flexible display 400 is relatively large, a user may recognize information outputted through the relatively wide integrated screen of the flexible display 400.

As shown in FIG. 3, the flexible display 400 may be folded in the direction in which the one surface of the first frame 200 and the one surface of the second frame 300 overlap each other. In this case, the flexible display 400 is not exposed to the outside, and thus the flexible display 400 may be protected from damage. Further, the space occupied by the flexible display 400 in the interior of the vehicle 10 may be reduced.

For example, a user may desire to obtain various pieces of information through a relatively large screen. In some cases, as shown in FIG. 4, the user may first unfold the flexible display 400, and may then perform manipulation such that information such as driving information of the vehicle 10, surrounding environment information, and information on the content that the user is viewing or listening to, are displayed on the flexible display 400.

In some examples, when the vehicle display device 100 is not used, the user may desire to protect the flexible display 400, which is relatively weak, by avoiding exposure thereof to the outside. In particular, the vehicle display device 100, which is mounted in the vehicle 10, may be used in a hot environment in summer or in a cold environment in winter. In some examples, the exposed portion of the flexible display 400 may be minimized when not in use.

In this regard, when it is sensed by the sensor 140 that the flexible display 400 needs to be protected from the surrounding environment, such as in the case of bad weather, the controller 180 may perform control such that the flexible display 400 is automatically folded to be protected.

Further, depending on the driving mode of the vehicle 10, information may be outputted through the first area 401 and the second area 402 of the flexible display 400 in a whole-screen mode or in a divided-screen mode. In this way, the display function may be optimally implemented to be suitable for any of various situations.

As described above, in the vehicle display device 100, the flexible display 400, which is disposed on one surface of the first frame 200 and one surface of the second frame 300, is foldable in the direction in which the one surface of the first frame 200 and the one surface of the second frame 300 overlap each other. Thus, it may be possible to optimally change the screen area of the flexible display 400 according to the needs of the user.

In some examples, as illustrated in FIG. 2, the vehicle display device 100 may be mounted to the dashboard of the vehicle 10 to protrude upwards above the dashboard, but the present disclosure is not limited thereto. The vehicle display device 100 may be mounted in any of various configurations in the interior of the vehicle 10. For example, the vehicle display device 100 may be mounted on the ceiling of the vehicle 10 to protrude downwards.

The first frame 200, the second frame 300, and the flexible display 400 may be disposed in a housing, which corresponds to a case or a cover forming the external appearance of the vehicle display device 100. In addition, various electronic components may be disposed in the housing.

In particular, a bezel structure may be formed along the edge of the flexible display 400. The bezel structure may be separated into pieces at the portion thereof corresponding to the connection part between the first frame 200 and the second frame 300, thereby avoiding interference with the first frame 200 and the second frame 300 during folding and unfolding of the flexible display 400.

The vehicle display device 100 may further include an auxiliary display 800, which is disposed on the opposite surface of the second frame 300.

In this case, the auxiliary display 800 is configured to perform a display function separately from the flexible display 400. The auxiliary display 800 is disposed to output information at all times in a direction opposite the direction in which the flexible display 400 outputs information, even when the flexible display 400 is folded and unfolded.

Accordingly, as shown in FIG. 3, even when the flexible display 400 is in the folded state and is thus not exposed to the outside, the user may confirm information outputted through the auxiliary display 800.

For example, in order to more fully concentrate on driving, the user may desire that only essential information, such as information pertaining to driving of the vehicle 10, is displayed on the auxiliary display 800 in the state in which the screen area of the flexible display 400 is minimized. This is because the flexible display 400, when unfolded as described above, is increasingly likely to block the field of vision of the user and to distract the attention of the user.

In this case, as shown in FIG. 3, the user may perform manipulation such that the flexible display 400 is folded and only essential information is displayed on the minimized screen through the auxiliary display 800.

In addition, as shown in FIG. 3, in the state in which the flexible display 400 is folded, the vehicle display device 100 may be controlled such that only very simple information, such as the phone number of the user, is displayed on the auxiliary display 800 to be shown to a person present outside the vehicle 10.

As described above, in the vehicle display device 100, since the auxiliary display 800 is disposed on the opposite surface of the second frame 300, it may be possible to implement a display function using the auxiliary display 800 when the flexible display 400 is in the folded state.

Figure 5:
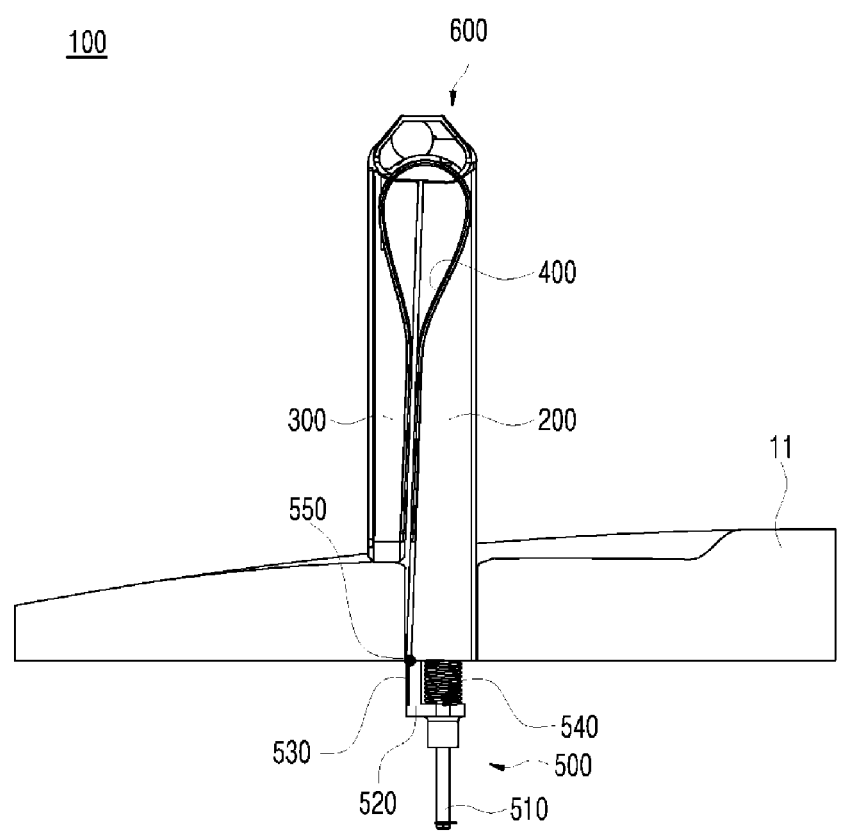
FIGS. 5 and 6 are cross-sectional views showing an example of a vehicle display device.
Figure 6:
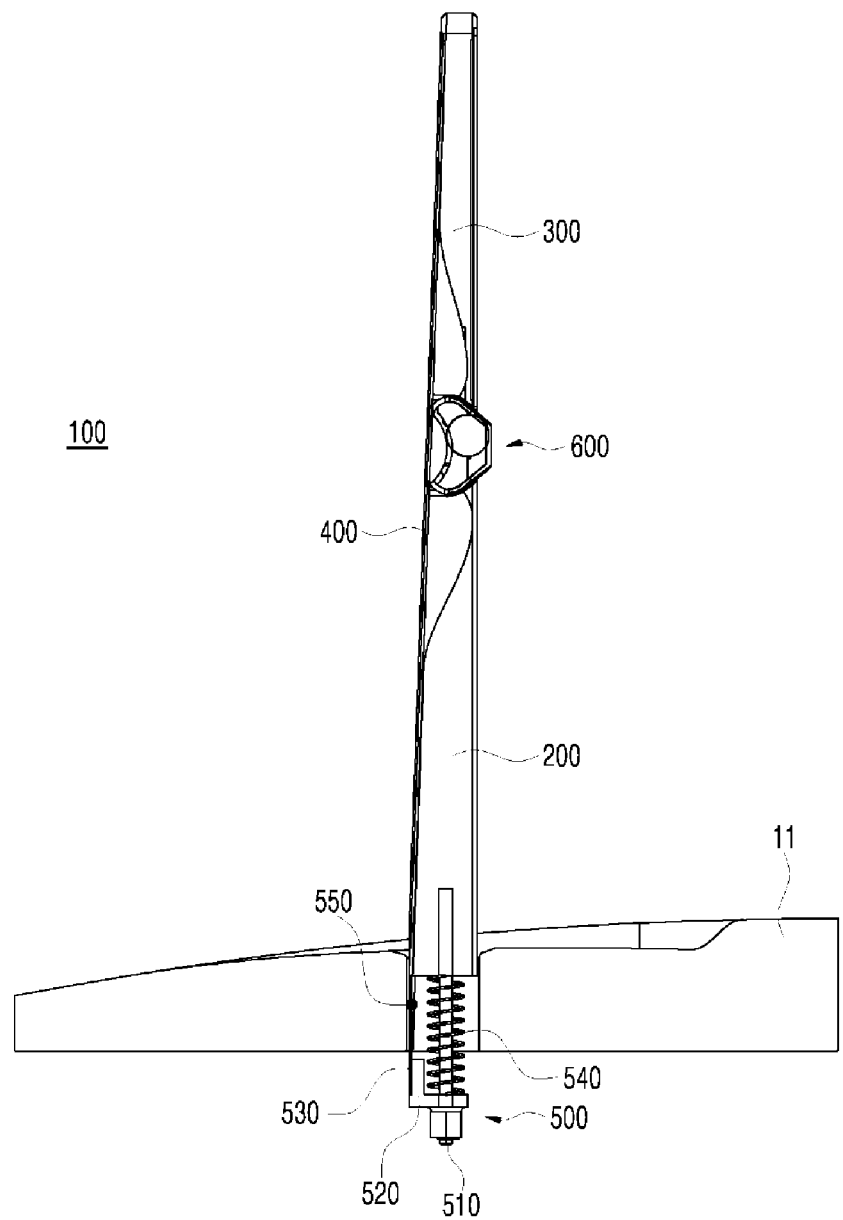

FIGS. 5 and 6 are cross-sectional views showing a vehicle display device.

As shown in FIGS. 5 and 6, the vehicle display device 100 may further include an elastic part 500, which applies tension to the flexible display 400 in a direction oriented toward the inside of the interior member 11 when the flexible display 400 is unfolded.

The length of the flexible display 400, which is disposed on one surface of the first frame 200 and one surface of the second frame 300, may not be exactly identical to the sum of the length of the first frame 200 and the length of the second frame 300.

That is, while the length of the flexible display 400 in the folded state may correspond to the sum of the length of the first frame 200 and the length of the second frame 300, the length of the flexible display 400 in the unfolded state may not be identical to the sum of the length of the first frame 200 and the length of the second frame 300.

Accordingly, the flexible display 400 may not be securely supported by the first frame 200 and the second frame 300 in the unfolded state, and a portion thereof may be wrinkled or crooked.

As such, the display function of the vehicle display device 100 may not be smoothly implemented. For example, an image outputted through the flexible display 400 may be distorted.

Therefore, in the vehicle display device 100, in response to the flexible display 400 being unfolded, tension is applied to the flexible display 400 in a direction oriented toward the inside of the interior member 11, thereby helping to prevent the flexible display 400 from being wrinkled or crooked due to the difference in the length described above.

As such, in the vehicle display device 100, in response to the flexible display 400 being unfolded, the elastic part 500 applies tension to the flexible display 400 to maintain the flatness of the surface of the flexible display 400. As a result, when the screen area of the flexible display 400 is changed, the display function of the flexible display 400 may be consistently maintained.

In the vehicle display device 100, the elastic part 500 may include an elastic shaft 510, a moving body 520, a connector 530, and an elastic body 540.

The elastic shaft 510 is a part that protrudes from one end of the first frame 200 and is mounted in the interior member 11. The elastic shaft 510 may guide the direction in which tension is applied to the flexible display 400.

The moving body 520 is configured to apply tension to the flexible display 400 while moving in the longitudinal direction of the elastic shaft 510. Thus, tension may be applied to the flexible display 400 in a direction parallel to the longitudinal direction of the elastic shaft 510.

The moving body 520 is a part that is coupled to the elastic shaft 510 to be movable in the longitudinal direction of the elastic shaft 510. Movement of the moving body 520 in directions other than the longitudinal direction of the elastic shaft 510 may be restrained, and thus the direction in which tension is applied to the flexible display 400 may be set as described above.

The connector 530 is a part that connects the flexible display 400 and the moving body 520 to each other. In response to the moving body 520 moving as described above, tension may be transmitted to the flexible display 400 connected to the moving body 520 via the connector 530.

The elastic body 540 is a part that is interposed between the moving body 520 and one end of the first frame 200 to apply elastic force to the moving body 520 with respect to the one end of the first frame 200. That is, the elastic body 540 may bias the moving body 520 away from the one end of the first frame 200 using the elastic force thereof. As such the moving body 520 may be moved.

Accordingly, the moving body 520 may be moved in the longitudinal direction of the elastic shaft 510 by the elastic force of the elastic body 540, and the connector 530 connected to the moving body 520 may pull the flexible display 400. In this manner, tension may be applied to the flexible display 400.

As described above, in the vehicle display device 100, the elastic part 500 may apply tension to the flexible display 400 using the elastic force generated by the elastic shaft 510, the moving body 520, the connector 530, and the elastic body 540. As a result, it may be possible to more stably apply tension to the flexible display 400.

In the vehicle display device 100, a support bar 550 may be disposed at an end portion of the flexible display 400 in the width direction of the flexible display 400. For example, FIG. 5 illustrates a cross section of the support bar 550 that extends in the width direction (e.g., a left-right direction or a horizontal direction) of the flexible display 400. The connector 530 may be coupled at one end thereof to the support bar 550, and may be coupled at the opposite end thereof to the moving body 520.

When the connector 530 pulls the flexible display 400 as described above, if tension is applied only to a specific portion of the flexible display 400, the flexible display 400 may be deformed or skewed by eccentric force.

Therefore, the support bar 550, which is formed in a tubular or rod configuration, may be coupled to the end portion of the flexible display 400 in the width direction of the flexible display 400, and the connector 530 may pull the support bar 550. As such, it may be possible to prevent or reduce application of eccentric force to a specific portion of the flexible display 400.

As described above, in the vehicle display device 100, the elastic part 500 applies tension to the flexible display 400 by pulling the support bar 550 disposed at the end portion of the flexible display 400 in the width direction of the flexible display 400. As a result, the tension applied to the end portion of the flexible display 400 may be evenly dispersed in the width direction of the flexible display 400.

Figure 7:
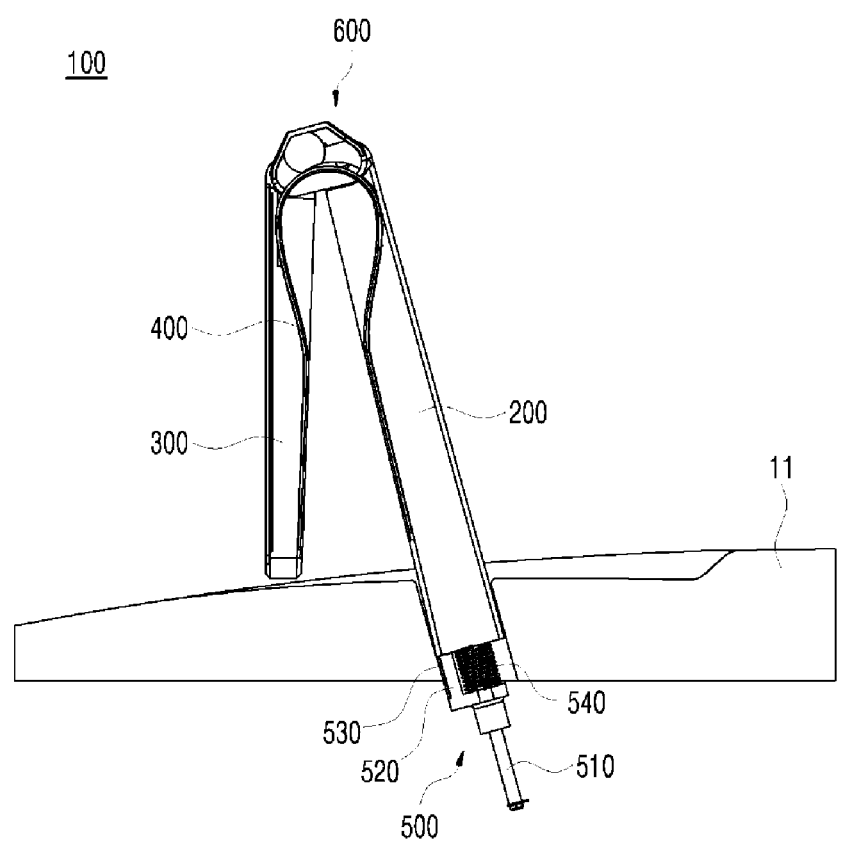
FIG. 7 is a view exemplarily showing an example first frame and an example second frame of a vehicle display device.

FIG. 7 is a view exemplarily showing the arrangement of the first frame and the second frame in a vehicle display device.

As shown in FIG. 7, in the vehicle display device 100, the first frame 200 may protrude upwards above the surface of the interior member 11, and the second frame 300 may be disposed so as not to be parallel to the first frame 200.

That is, in the process of changing the screen area through the above-described folding and unfolding of the flexible display 400, the flexible display 400 may be folded up to an angle at which the one surface of the first frame 200 and the one surface of the second frame 300 do not contact each other. Accordingly, the angle formed between the first frame 200 and the second frame 300 may vary within a range greater than 0° and equal to or less than 180°.

In response to the one surface of the first frame 200 and the one surface of the second frame 300 coming into close contact with each other, that is, becoming parallel to each other (where the angle therebetween is 0°), the curvature with which the boundary area between the first area 401 and the second area 402 of the flexible display 400 is folded greatly increases. Accordingly, stress may be concentrated on the folded portion of the flexible display 400, which may damage or deform the same.

In some implementations, in response to the flexible display 400 being folded up to an angle at which the one surface of the first frame 200 and the one surface of the second frame 300 do not come into close contact with each other, the curvature with which the boundary area between the first area 401 and the second area 402 of the flexible display 400 is folded relatively decreases, and the amount of stress concentrated on the folded portion of the flexible display 400 may thus be reduced.

Accordingly, the flexible display 400 is less likely to be damaged or deformed. In addition, the above-described functions of displaying information to the inside and the outside of the vehicle 10 and protecting the flexible display 400 may still be smoothly implemented.

As described above, the vehicle display device 100 is configured such that the first frame 200 protrudes upwards above the surface of the interior member 11 and such that the second frame 300 is disposed so as not to be parallel to the first frame 200, which may help to prevent the flexible display 400 from being excessively folded, and consequently minimizing damage thereto or deterioration in the function thereof.

The vehicle display device 100 may further include a first hinge 600 interposed between the first frame 200 and the second frame 300 to connect the second frame 300 to the first frame 200. The first hinge 600 serves to adjust a coupling angle between the second frame 300 and the first frame 200.

That is, as shown in FIG. 7, the first frame 200 and the second frame 300 are connected to each other via the first hinge 600. The coupling angle between the first frame 200 and the second frame 300 may be adjusted through the rotation of the first hinge 600 relative to the first frame 200 and the rotation of the second frame 300 relative to the first hinge 600.

Due to the connecting structure using the first hinge 600, the rotational degree of freedom of each component may increase above that when the first frame 200 and the second frame 300 are directly connected to each other.

As described above, in the vehicle display device 100, the angle between the first frame 200 and the second frame 300 is adjusted using the first hinge 600. As a result, it may be possible for the user to appropriately adjust the angle between the first frame 200 and the second frame 300 according to the user needs.

Figure 8:
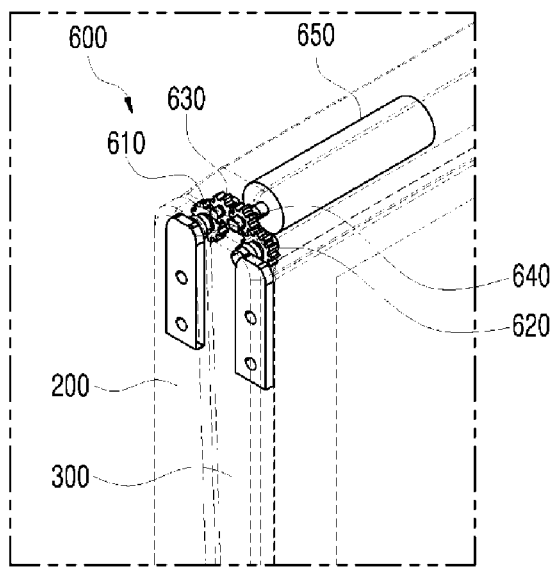
FIGS. 8 and 9 are views showing an example first hinge of a vehicle display device.
Figure 9:
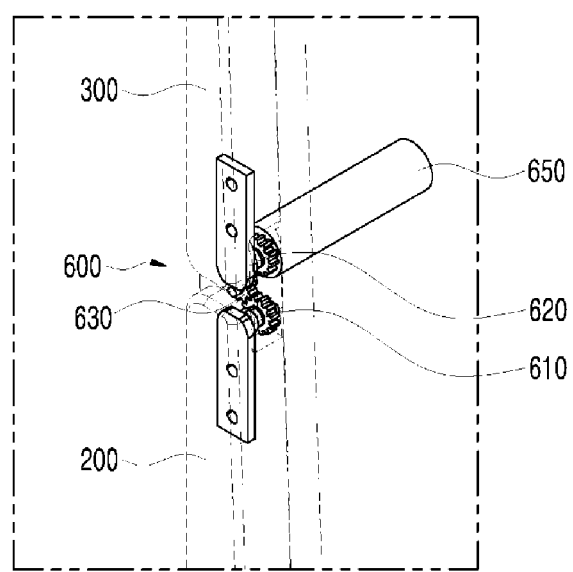

FIGS. 8 and 9 are views showing the first hinge of a vehicle display device in more detail.

As shown in FIGS. 8 and 9, in the vehicle display device 100, the first hinge 600 may include a first gear 610, a second gear 620, a third gear 630, and a fourth gear 640.

The first gear 610 may be mounted to the opposite end of the first frame 200 such that the rotation angle thereof is restricted by the first frame 200. The arrangement angle of the first frame 200 may be changed according to the rotation of the first gear 610.

The second gear 620 may be mounted to the one end of the second frame 300 such that the rotation angle thereof is restricted by the second frame 300. The arrangement angle of the second frame 300 may be changed according to the rotation of the second gear 620.

The third gear 630 may include threads engaged with the first gear 610 to be rotatable with respect to the first gear 610. The first gear 610 may be rotated in conjunction with the rotation of the third gear 630.

The fourth gear 640 may include threads engaged both with the second gear 620 and with the third gear 630 to transmit rotational force between the second gear 620 and the third gear 630. The second gear 620 and the third gear 630 may be rotated in conjunction with the rotation of the fourth gear 640.

Due to this structure, even when only one of the first to fourth gears 610 to 640 is rotated, all of the remaining ones thereof may be rotated together therewith.

For example, the case in which external force is applied to the second frame 300 in the state shown in FIG. 8 will be described below.

In response to external force being applied to the second frame 300, the second frame 300 is moved such that the arrangement angle of the second frame 300 with respect to the first frame 200 increases, and the flexible display 400 is thus unfolded. As such, the second gear 620 mounted to the second frame 300 is rotated in the counterclockwise direction.

In response to the second gear 620 being rotated, the fourth gear 640 engaged with the second gear 620 may be rotated in the clockwise direction. For example, the second gear 620 and the fourth gear 640 may include threads engaged with each other. The third gear 630 engaged with the fourth gear 640 may be rotated in the counterclockwise direction according to the rotation of the fourth gear 640. For example, the third gear 630 and the fourth gear 640 may include threads engaged with teach other. As a result, according to the rotation of the third gear 630, rotational force in the clockwise direction is applied to the first gear 610 engaged with the third gear 630. For example, the first gear 610 and the third gear 630 may include threads engaged with each other.

As described above, since the first frame 200 is coupled at the one end thereof to the interior member 11, the rotation of the first frame 200 may be restrained by the interior member 11. Therefore, although rotational force is applied to the first gear 610, the rotation of the first frame 200 is restrained, and thus the rotational force applied to the first gear 610 may reversely accelerate the counterclockwise rotation of the third gear 630.

Likewise, the clockwise rotation of the fourth gear 640 and the counterclockwise rotation of the second gear 620 may be sequentially accelerated. As a result, the unfolding operation of the second frame 300 may be further accelerated, and the second frame 300 may be changed to the state shown in FIG. 9.

As described above, in the vehicle display device 100, the angle between the first frame 200 and the second frame 300 is adjusted by the rotational force transmitted through the first gear 610, the second gear 620, the third gear 630, and the fourth gear 640, which constitute the first hinge 600. As a result, the angle between the first frame 200 and the second frame 300 may be adjusted more smoothly and easily.

In the vehicle display device 100, the first hinge 600 may further include a first motor 650 coupled to the fourth gear 640 in order to provide driving force to the fourth gear 640 to rotate the same.

In response to the fourth gear 640 being rotated by the driving force of the first motor 650, the first gear 610, the second gear 620, and the third gear 630 may be respectively rotated as described above, and the folded state and the unfolded state of the flexible display 400 may be automatically adjusted.

In particular, based on the operation of the first motor 650 being controlled in stages by the controller, it is also possible to adjust, in stages, the degree to which the flexible display 400 is folded or unfolded.

As described above, in the vehicle display device 100, the angle between the first frame 200 and the second frame 300 is automatically adjusted by the driving force supplied from the first motor 650 of the first hinge 600. As a result, it may be possible to more easily adjust the angle between the first frame 200 and the second frame 300 without the necessity of manual operation by the user.

Figure 10:
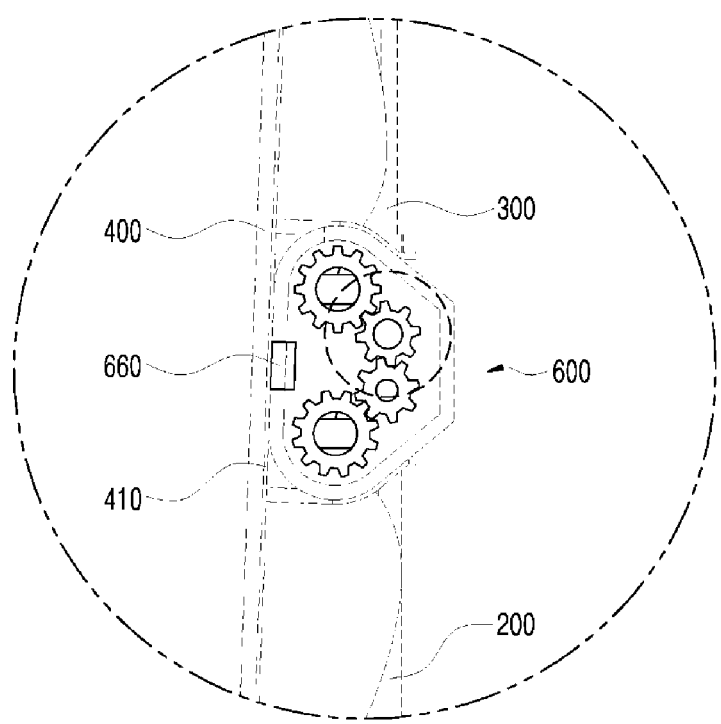
FIG. 10 is a view showing an example backplate and an example magnet of a vehicle display device.

FIG. 10 is a view showing a backplate and a magnet of a vehicle display device.

As shown in FIG. 10, the vehicle display device 100 may further include a backplate 410 and a magnet 660.

The backplate 410 is a metallic part that is attached to the rear surface of the flexible display 400 and is disposed on one surface of the first frame 200 and one surface of the second frame 300. The backplate 410 may support a specific portion of the rear surface of the flexible display 400 in a flat surface state.

In this case, the backplate 410 may also be formed of a flexible material that is bendable so that the flexible display 400 is smoothly folded and unfolded.

The magnet 660 is mounted in the first hinge 600 in order to enable close contact between the backplate 410 and the first hinge 600 using the magnetic force thereof. The magnet 660 may prevent or reduce the occurrence of a gap between the backplate 410 and the first hinge 600 during a change in the shape of the flexible display 400.

As described above, wrinkles or irregularities may occur in a portion of the flexible display 400 in the unfolded state, which may cause a gap to form between the first hinge 600 and the portion of the flexible display 400 that cannot be fixedly attached to the first hinge 600 to change the curvature thereof.

For this reason, the magnet 660 is mounted in the first hinge 600, and the metallic backplate 410 is attached to the rear surface of the flexible display 400, thereby minimizing the occurrence of a gap between the flexible display 400 and the first hinge 600 using the magnetic force of the magnet 660.

In particular, the magnetic force of the magnet 660 is effective in attracting the backplate 410, but does not obstruct the sliding movement of the backplate 410 in the longitudinal direction of the flexible display 400, so that the flexible display 400 is smoothly folded and unfolded.

As described above, in the vehicle display device 100, since the metallic backplate 410 attached to the rear surface of the flexible display 400 is attracted to the first hinge 600 by the magnetic force of the magnet 660, it may be possible to prevent or reduce the occurrence of a gap between the flexible display 400 and the first hinge 600 during the change in the screen area of the flexible display 400.

Figure 11:
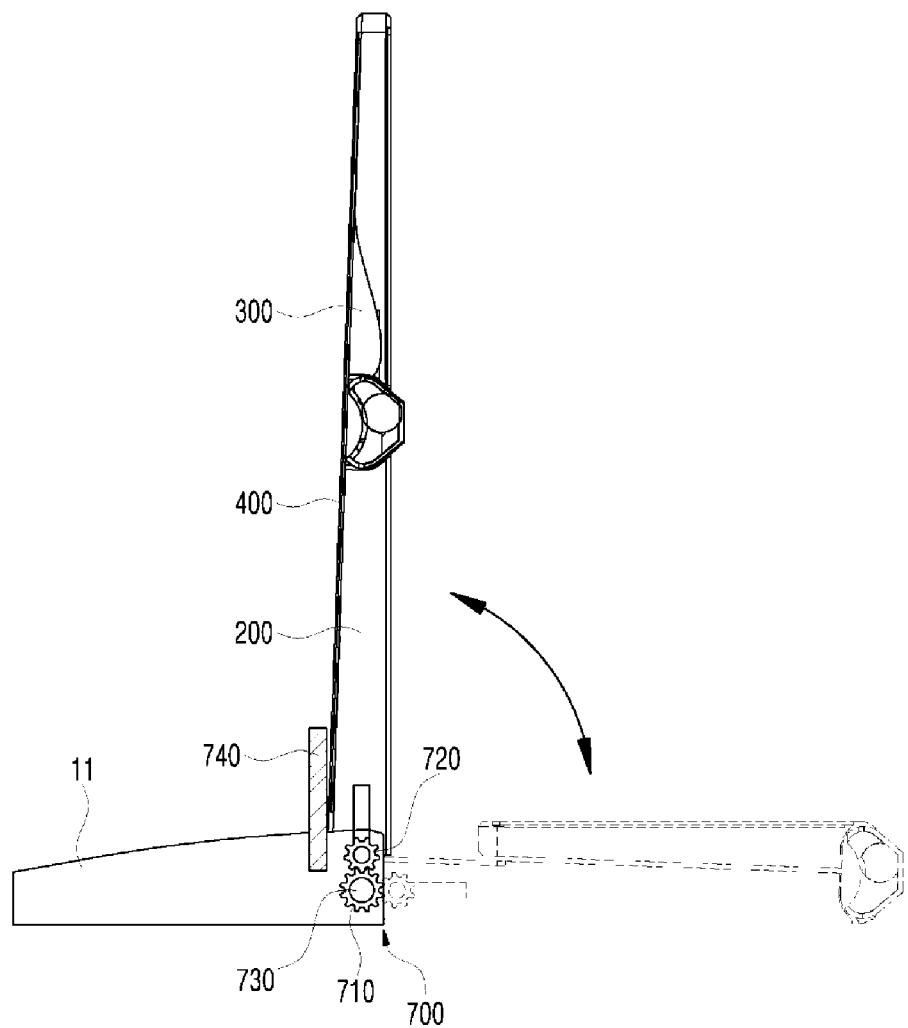
FIG. 11 is a view showing an example of changing an angle of a first frame with respect to an interior member of a vehicle.

FIG. 11 is a view exemplarily showing the operation of changing an angle at which the first frame protrudes upwards with respect to the surface of the interior member in a vehicle display device.

As shown in FIG. 11, in the vehicle display device 100, the first frame 200 is mounted such that the angle at which the first frame 200 protrudes upwards with respect to the surface of the interior member 11 (hereinafter, referred to as a "protruding angle") is changeable. The flexible display 400 may be unfolded in response to the protruding angle of the first frame 200 being equal to or greater than a preset value.

In this case, the preset value may be an arbitrary angular value that is separately set by the user or preset in the process of manufacturing the vehicle display device 100. In practice, the preset value may be a value that is set to allow the unfolding operation of the flexible display 400 only when the vehicle display device 100 is being used.

For example, when the user is not using the vehicle display device 100, the user may desire to minimize the amount of the flexible display 400 that protrudes above the surface of the interior member 11 to provide the field of vision of the user or to avoid interference with other components.

In some examples, the user may lay the vehicle display device 100 down by reducing the protruding angle of the first frame 200. Further, in this case, the flexible display 400 may not need to be unfolded.

In some examples, when the user desires to use the vehicle display device 100 again, the user may cause the vehicle display device 100 to protrude upwards by increasing the protruding angle of the first frame 200.

Further, in response to the vehicle display device 100 protruding upwards at a predetermined angle or greater, the flexible display 400 may be naturally unfolded to increase user convenience.

As described above, in the vehicle display device 100, since the flexible display 400 is unfolded in response to the protruding angle of the first frame 200 with respect to the surface of the interior member 11 being adjusted to be equal to or greater than a preset value, it may be possible to prevent interference between components during the change in the screen area of the flexible display 400.

The vehicle display device 100 may further include a second hinge 700 interposed between the first frame 200 and the interior member 11 to connect the first frame 200 to the interior member 11. The second hinge 700 serves to adjust the coupling angle between the first frame 200 and the interior member 11.

That is, as shown in FIG. 11, the first frame 200 and interior member 11 are connected to each other via the second hinge 700. The coupling angle between the first frame 200 and the interior member 11 may be adjusted through the rotation of the second hinge 700 relative to the interior member 11 and the rotation of the first frame 200 relative to the second hinge 700.

Due to the connecting structure using the second hinge 700, the rotational degree of freedom of each component may increase above that when the first frame 200 and the interior member 11 are directly connected to each other.

As described above, in the vehicle display device 100, the angle between the interior member 11 and the first frame 200 is adjusted using the second hinge 700. As a result, it may be possible for the user to appropriately adjust the angle between the interior member 11 and the first frame 200 according to user needs.

In the vehicle display device 100, the second hinge 700 may include a fifth gear 710, a sixth gear 720, and a second motor 730.

The fifth gear 710 may be mounted in the interior member 11. The fifth gear 710 may be mounted such that the movement thereof in all directions is restrained, but the rotation thereof is not restrained by the interior member 11.

The sixth gear 720 may be mounted to the one end of the first frame 200 such that the rotation angle thereof is restricted by the first frame 200. The sixth gear 720 may include threads engaged with the fifth gear 710. The arrangement angle of the first frame 200 may be changed according to the rotation of the sixth gear 720. Further, the sixth gear 720 may be rotated in conjunction with the rotation of the fifth gear 710.

The second motor 730 may be coupled to the fifth gear 710 in order to provide driving force to the fifth gear 710 to rotate the same. When the fifth gear 710 is rotated by the driving force of the second motor 730, the sixth gear 720 may be rotated, and the rotation angle of the first frame 200 may be automatically adjusted.

In particular, based on the operation of the second motor 730 being controlled in stages by the controller, it is also possible to adjust, in stages, the rotation angle of the first frame 200.

As described above, in the vehicle display device 100, the angle between the interior member 11 and the first frame 200 is adjusted by the fifth gear 710, the sixth gear 720, and the second motor 730, which constitute the second hinge 700. As a result, it may be possible to more smoothly and easily adjust the angle between the interior member 11 and the first frame 200.

In the vehicle display device 100, the second hinge 700 may further include a limiter 740 for limiting the rotation angle of the first frame 200. For example, the limiter 740 may be a protrusion that protrudes from the interior member 11 and is configured to contact the first frame 200 or the flexible display 400.

As described above, when the vehicle display device 100 is made to protrude upwards to be used, the first frame 200 may not be rotated so far that the vehicle display device 100 is laid down in the opposite direction.

In response to the amount of the vehicle display device 100 that protrudes upwards above the interior member 11 increasing, the screen area of the flexible display 400, through which the user is capable of visually recognizing information, increases. In some examples, the rotation angle of the first frame 200 may be limited within a predetermined range.

For example, as shown in FIG. 11, the limiter 740 is mounted in order to restrict the first frame 200 from being laid down in the opposite direction, thereby optimizing the use state of the vehicle display device 100.

As described above, in the vehicle display device 100, since the rotation angle of the first frame 200 is limited by the limiter 740 of the second hinge 700, it may be possible to restrict the first frame 200 from being further rotated from the limiter 740, thus preventing or reducing deterioration in the usability of the vehicle display device 100.

Figure 12:
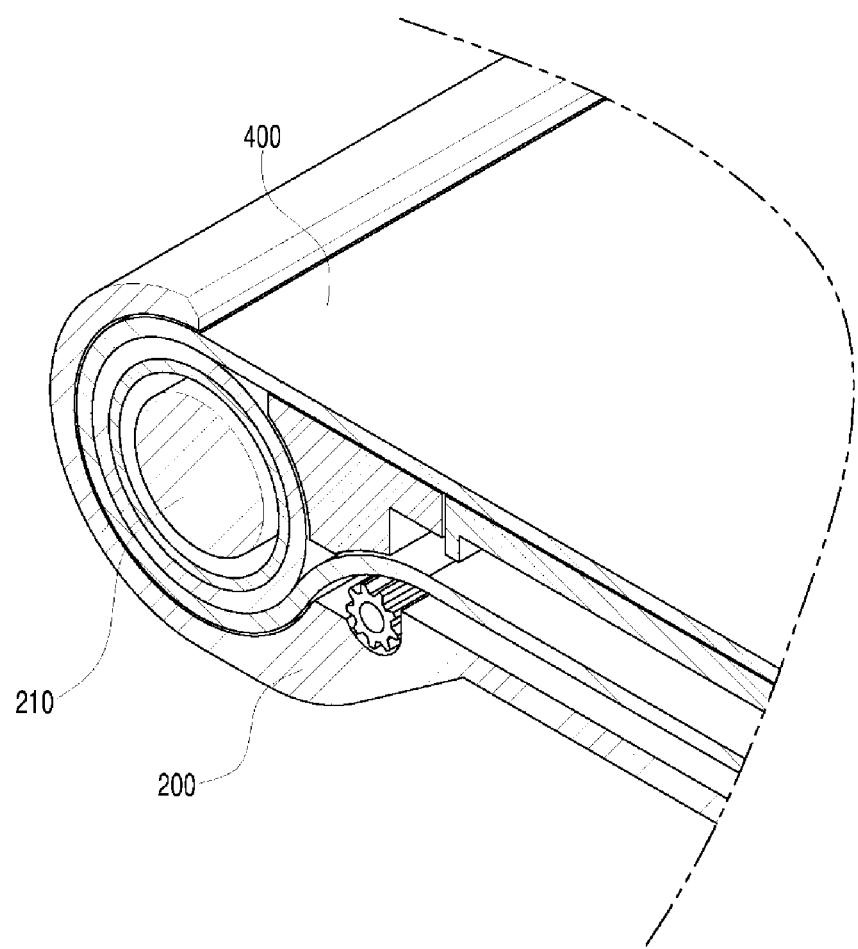
FIG. 12 is a view showing an example configuration of a flexible display that is wound around a first frame.

FIG. 12 is a view exemplarily showing the configuration in which a portion of the flexible display 400 is wound on the first frame in a vehicle display device.

In the vehicle display device 100, the flexible display 400 may be disposed such that at least a portion thereof is wound on the first frame 200.

As described above, the length of the flexible display 400 may not be exactly identical to the sum of the length of the first frame 200 and the length of the second frame 300. Therefore, the length of the flexible display 400 needs to be adjusted to some extent during the folding and unfolding operation.

Further, during the use of the vehicle display device 100, there may exist other cases outside of the unfolding operation in which the screen area of the flexible display 400 needs to be additionally increased.

Therefore, it may be desirable for the flexible display 400 to have an extra portion having a predetermined length. Accordingly, the extra portion of the flexible display 400 needs to be disposed to avoid exposure to the outside when not in use.

As described above, in the vehicle display device 100, since at least a portion of the flexible display 400 is wound on the first frame 200, it may be possible to secure an extra portion of the flexible display 400, thereby further increasing the screen area of the flexible display 400.

In the vehicle display device 100, the first frame 200 may include a roller 210 disposed at the one end of the first frame 200 and configured such that at least a portion of the flexible display 400 is wound thereon. That is, as shown in FIG. 12, the extra portion of the flexible display 400 may be stored in the state of being wound on the roller 210 disposed at the one end of the first frame 200.

In some implementations, the extra portion of the flexible display 400 may be disposed to avoid exposure to the outside when not in use. In some cases, a relatively large storage space may be needed to insert the extra portion of the flexible display 400 into the interior member 11, and the flexible display 400 may interfere with other components of the vehicle 10.

Therefore, in some implementations, the extra portion of the flexible display 400 may be wound on the roller 210 in order to overcome the limitations associated with storage space and interference between components.

As described above, in the vehicle display device 100, since at least a portion of the flexible display 400 is wound on the roller 210 disposed at the one end of the first frame 200, it may be possible to easily store the extra portion of the flexible display 400.

Figure 13:
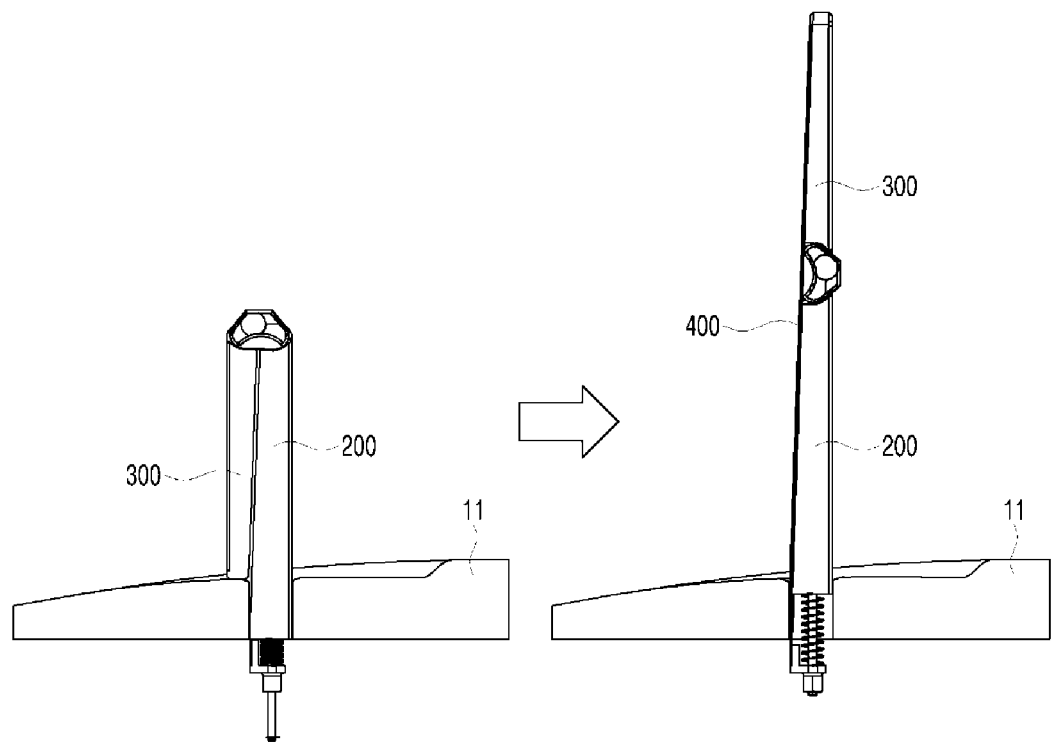
FIG. 13 is a view showing an example of movement of an example first frame of a vehicle display device.
Figure 14:
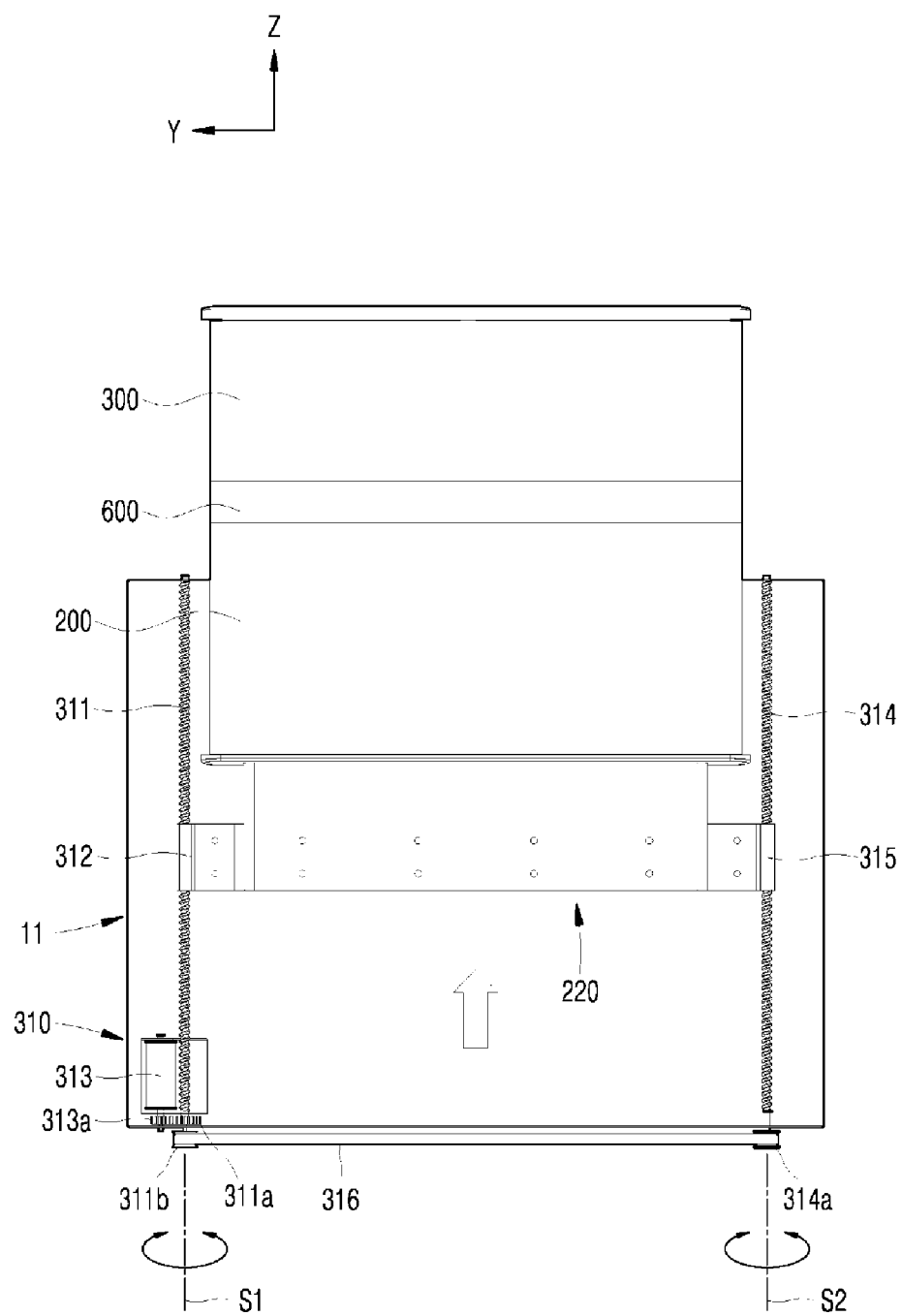
FIG. 14 is a view showing an example of movement of an example first frame of a vehicle display device.

FIG. 13 is a view exemplarily showing the movement of the first frame of a vehicle display device. FIG. 14 is a view showing the first frame of a vehicle display device in more detail.

In the vehicle display device 100, a portion of the first frame 200 may be inserted into the interior member 11, and the portion of the first frame 200 may be moved to be exposed to the outside of the interior member 11 when the flexible display 400 is unfolded.

That is, as shown in FIG. 13, the one end of the first frame 200 may be mounted to be inserted into the interior member 11. In the folded state of the flexible display 400, the insertion depth of the one end of the first frame 200 may be maximized in order to minimize the protruding height of the flexible display 400 when not in use.

In some examples, in response to the flexible display 400 being unfolded to be used, the portion of the first frame 200 that is inserted into the interior member 11 may be moved to be exposed to the outside of the interior member 11 in order to maximize the screen area of the flexible display 400.

As described above, in the vehicle display device 100, since the portion of the first frame 200 that is inserted into the interior member 11 is exposed to the outside of the interior member 11 when the flexible display 400 is unfolded, it may be possible to further increase the height that the flexible display 400 protrudes upwards above the surface of the interior member 11 when unfolded.

Further, in the vehicle display device 100, the portion of the flexible display 400 that is wound on the roller 210 may be spread corresponding to the movement of the first frame 200.

That is, when the above-described inserted portion of the first frame 200 is exposed to the outside of the interior member 11, the extra portion of the flexible display 400 that is wound on the roller 210 may be spread corresponding thereto, thereby additionally increasing the screen area of the flexible display 400.

As described above, in the vehicle display device 100, since the extra portion of the flexible display 400 that is wound on the roller 210 is spread corresponding to the exposure of the first frame 200 to the outside of the interior member 11, it may be possible to additionally increase the screen area of the flexible display 400 when the flexible display 400 is unfolded.

In the vehicle display device 100, the first frame 200 may include an ascending/descending body 220 and a linear actuator 310.

The ascending/descending body 220 may be coupled to the one end of the first frame 200 inside the interior member 11. For example, the ascending/descending body 220 may be an inner body that is coupled to the first (lower) end of the first frame and disposed inside the interior member 11, and that is configured to move upward and downward relative to the interior member 11. As shown in FIG. 14, the ascending/descending body 220 may be moved in the vertical direction, and may move the first frame 200.

The linear actuator 310 may be formed in the direction in which the first frame 200 moves inside the interior member 11. The linear actuator 310 may provide a movement path of the ascending/descending body 220, and may transmit driving force to the ascending/descending body 220 to move the same. As shown in FIG. 14, the linear actuator 310 may move the ascending/descending body 220 in the vertical direction.

Specifically, the linear actuator 310 includes a first screw shaft 311, a first slider 312, and a third motor 313. The linear actuator 310 may further include a second screw shaft 314, a second slider 315, and an interlocking belt 316.

The first screw shaft 311 may be formed to be elongated in the vertical direction, and may have threads formed in the outer circumferential surface thereof. The first screw shaft 311 may be rotatably coupled to the interior member 11.

The first screw shaft 311 may be configured to rotate about a first rotation axis 51 that extends in parallel to the vertical direction.

The first slider 312 may be secured to the ascending/descending body 220, and may include threads engaged with the first screw shaft 311. The threaded engagement between the first screw shaft 311 and the first slider 312 may be realized in a manner such that the first screw shaft 311 penetrates the first slider 312.

The first slider 312 may be formed as a female thread type and include threads engaged with the first screw shaft 311. The first slider 312 may move in the vertical direction during the rotation of the first screw shaft 311. That is, during the rotation of the first screw shaft 311, the first slider 312 may move upwards or downwards, and accordingly, the ascending/descending body 220 may move upwards or downwards with respect to the interior member 11.

The third motor 313 may be configured to rotate the first screw shaft 311.

The third motor 313 may be a motor configured to be rotated by electrical energy. For example, the third motor 313 may include a step motor.

The third motor 313 may be secured to the interior member 11.

The third motor 313 may be configured to rotate the first screw shaft 311. For example, there may be provided a gear 313a coupled to the rotary shaft of the third motor 313 to be rotated together therewith, and a gear 311a that is disposed coaxially with the first screw shaft 311 and that meshes with the gear 313a to be rotated together therewith.

The second screw shaft 314 may be formed to be elongated in the vertical direction, and may have threads formed in the outer circumferential surface thereof. The second screw shaft 314 may be rotatably coupled to the interior member 11.

The second screw shaft 314 may be configured to rotate about a second rotation axis S2, which is parallel to the vertical direction.

The second screw shaft 314 may be disposed parallel to the first screw shaft 311.

The second slider 315 may be secured to the ascending/descending body 220, and may include threads engaged with the second screw shaft 314. The threaded engagement between the second screw shaft 314 and the second slider 315 may be realized in a manner such that the second screw shaft 314 penetrates the second slider 315.

The second slider 315 may be formed as a female thread type and include threads engaged with the second screw shaft 314. The second slider 315 may move in the vertical direction during the rotation of the second screw shaft 314. That is, during the rotation of the second screw shaft 314, the second slider 315 may move upwards or downwards, and accordingly, the ascending/descending body 220 may move upwards or downwards with respect to the interior member 11.

The interlocking belt 316 may connect the first screw shaft 311 and the second screw shaft 314 to each other so that the first screw shaft 311 and the second screw shaft 314 rotate in conjunction with each other. To this end, a first pulley 311b may be coupled to the lower end of the first screw shaft 311, a second pulley 314a may be coupled to the lower end of the second screw shaft 314, and the interlocking belt 316 may be suspended on the first pulley 311b and the second pulley 314a.

In some implementations, the first screw shaft 311 and the second screw shaft 314 may be formed to be identical to each other, or may be symmetrical with each other with respect to the ascending/descending body 220, and the first slider 312 and the second slider 315 may be formed to be identical to each other, or may be symmetrical with each other with respect to the ascending/descending body 220. Further, the first pulley 311b and the second pulley 314a may have the same size.

Accordingly, during the rotation of the third motor 313, the first screw shaft 311 and the second screw shaft 314 may rotate at the same speed, and the first slider 312 and the second slider 315 may move at the same speed in the same direction. Thus, the left side and the right side of the ascending/descending body 220 may move upwards and downwards in a balanced manner.

As described above, in the vehicle display device 100, since the first frame 200 is moved into and out of the interior member 11 by the ascending/descending body 220 and the linear actuator 310, it may be possible to more smoothly and easily move the first frame 200.

While the foregoing has been given by way of illustrative example of the present disclosure, all such and other modifications and variations thereto as would be apparent to those skilled in the art are deemed to fall within the broad scope and ambit of this disclosure as is herein set forth. Accordingly, such modifications or variations are not to be regarded as a departure from the spirit or scope of the present disclosure, and it is intended that the present disclosure cover the modifications and variations of this disclosure provided they come within the scope of the appended claims and their equivalents.

What is claimed is:

1. A display device configured to be mounted in an indoor space of a vehicle and to change a display area, the display device comprising:
   a first frame having a first end configured to be coupled to an interior member of the vehicle;
   a second frame having a first end coupled to a second end of the first frame, the second frame being configured to rotate about the second end of the first frame;
   a flexible display disposed at a first surface of the first frame and a first surface of the second frame, the flexible display being configured to fold to allow the first surface of the first frame to face the first surface of the second frame; and
   an elastic part configured to apply tension to the flexible display in a direction toward an inside of the interior member based on the flexible display being unfolded,
   wherein the elastic part comprises:
      a shaft that protrudes from the first end of the first frame into the interior member,
      a moving body coupled to the shaft and configured to move in a longitudinal direction of the shaft,
      a connector that connects the flexible display and the moving body to each other, and
      an elastic body disposed between the first end of the first frame and the moving body and configured to apply elastic force to the moving body.

2. The display device of claim 1, further comprising:
   an auxiliary display disposed on a second surface of the second frame opposite to the first surface of the second frame.

3. The display device of claim 2, wherein the first frame protrudes upward relative to a surface of the interior member of the vehicle, and
   wherein the second frame is configured to be inclined with respect to the first frame.

4. The display device of claim 3, further comprising:
   a first hinge that is disposed between the first frame and the second frame and connects the second frame to the first frame, the first hinge being configured to adjust a coupling angle between the second frame and the first frame.

5. The display device of claim 4, wherein the first hinge comprises:
   a first gear disposed at the second end of the first frame, the first frame being configured to restrict rotation of the first gear;
   a second gear disposed at the first end of the second frame, the second frame being configured to restrict rotation of the second gear;
   a third gear engaged with the first gear and configured to rotate with respect to the first gear; and
   a fourth gear engaged with the second gear and the third gear, the fourth gear being configured to transmit rotational force between the second gear and the third gear.

6. The display device of claim 5, wherein the first hinge further comprises:
   a first motor coupled to the fourth gear and configured to provide driving force to the fourth gear.

7. The display device of claim 4, further comprising:
   a metallic backplate that is attached to a rear surface of the flexible display and faces the first surface of the first frame and the first surface of the second frame; and
   a magnet disposed at the first hinge and configured to provide magnetic force to attach between the metallic backplate to the first hinge.

8. The display device of claim 1, further comprising:
   a support bar that is disposed at an end portion of the flexible display and extends in a width direction of the flexible display,
   wherein the connector has an end coupled to the support bar and another end coupled to the moving body.

9. The display device of claim 1, wherein the flexible display has at least a portion configured to wind around the first frame.

10. The display device of claim 9, wherein the first frame comprises a roller disposed at the first end of the first frame, and
    wherein at least the portion of the flexible display is configured to wind around the roller.

11. The display device of claim 10, wherein the first frame comprises an insertion portion that is configured to:
    insert into the interior member based on the flexible display being folded; and
    move to an outside of the interior member based on the flexible display being unfolded.

12. The display device of claim 11, wherein at least the portion of the flexible display is configured to unwind from the roller based on movement of the first frame.

13. The display device of claim 12, wherein the first frame comprises:
    an inner body that is coupled to the first end of the first frame and disposed inside the interior member, the inner body being configured to move upward and downward relative to the interior member; and
    a linear actuator that extends along a movement direction of the first frame relative to the interior member and defines a movement path of the inner body, the linear actuator being configured to transmit driving force to move the inner body.

14. The display device of claim 13, wherein the linear actuator comprises:
    a screw shaft that is disposed inside the interior member and extends along the move direction of the first frame, the screw shaft having threads defined at an outer surface of the screw shaft;
    a motor disposed inside the interior member and configured to rotate the screw shaft; and
    a slider coupled to the inner body of the first frame and configured to move along the screw shaft based on rotation of the screw shaft.

15. A display device configured to be mounted in an indoor space of a vehicle and to change a display area, the display device comprising:
    a first frame having a first end configured to be coupled to an interior member of the vehicle;
    a second frame having a first end coupled to a second end of the first frame, the second frame being configured to rotate about the second end of the first frame; and
    a flexible display disposed at a first surface of the first frame and a first surface of the second frame, the flexible display being configured to fold to allow the first surface of the first frame to face the first surface of the second frame,
    wherein at least a portion of the first frame is configured to protrude from a surface of the interior member of the vehicle,
    wherein the first frame is configured to vary a protruding angle of the first frame with respect to the surface of the interior member, and wherein the flexible display is configured to be unfolded based on the protruding angle of the first frame being greater than or equal to a preset value.

16. The display device of claim 15, further comprising:
a hinge that is disposed between the first frame and the interior member and connects the first frame to the interior member, the hinge being configured to adjust a coupling angle between the first frame and the interior member.

17. The display device of claim 16, wherein the hinge comprises:
a first gear disposed at the interior member;
a second gear disposed at the first end of the first frame and engaged with the first gear, the first frame being configured to restrict rotation angle of the second gear; and
a motor coupled to the first gear and configured to provide driving force to rotate the first gear.

18. The display device of claim 17, wherein the hinge further comprises a limiting protrusion configured to limit rotation of the first frame relative to the interior member.

* * * * *